United States Patent [19]
Dobbelaere

[11] Patent Number: 6,031,388
[45] Date of Patent: Feb. 29, 2000

[54] POSTCHARGED INTERCONNECTION SPEED-UP CIRCUIT

[75] Inventor: Ivo Dobbelaere, Los Altos, Calif.

[73] Assignee: The Board of Trustees of the Leland Stanford Junior University, Palo Alto, Calif.

[21] Appl. No.: 08/896,614

[22] Filed: Jul. 18, 1997

Related U.S. Application Data

[60] Provisional application No. 60/022,552, Jul. 19, 1996.

[51] Int. Cl.[7] .................................................. H03K 19/01
[52] U.S. Cl. ................................. 326/17; 326/83; 326/86
[58] Field of Search .................................. 326/17, 86, 38, 326/83, 121

[56] References Cited

U.S. PATENT DOCUMENTS

| | | | |
|---|---|---|---|
| 4,700,086 | 10/1987 | Ling et al. | 326/25 |
| 4,829,199 | 5/1989 | Prater | 326/27 |
| 5,343,090 | 8/1994 | Proebsting . | |
| 5,440,182 | 8/1995 | Dobbelaere | 326/38 |
| 5,455,521 | 10/1995 | Dobbelaere | 326/17 |
| 5,742,192 | 4/1998 | Banik | 327/166 |
| 5,793,222 | 8/1998 | Nakase | 326/27 |

OTHER PUBLICATIONS

I. Dobbelaere, *Applications of Regenerative Feedback in Integrated Circuits*, Ph.D. Dissertation, Stanford University, Stanford, California, 1995, Chapter 2, pp. 10–50.

L. Glasser et al., *The Design and Analysis of VLSI Circuits*, Addison–Wesley, Reading, MA 1985, pp. 419–420.

C. Mead, *Analog VLSI and Neural Systems*, Addison–Wesley, Reading, MA, 1989, p. 202.

*Primary Examiner*—Michael Tokar
*Assistant Examiner*—Daniel D. Chang
*Attorney, Agent, or Firm*—Lumen Intellectual Property Services

[57] ABSTRACT

A circuit style, which may be employed in fast, area-efficient, flexible programmable interconnect architectures, or in logic circuits, is disclosed. In one embodiment, a plurality of postcharged speed-up circuits, each having a single network node, is connected to the intermediate nodes of a programmable interconnect architecture. Each speed-up circuit monitors the logic level on the network node. When a circuit detects a substantial change in logic level, away from the stand-by level, it temporarily enforces that change by connecting its network node to the signaling logic level. Thus, on each node, a low-impedance enhancement of the signal driving the node temporarily appears. This causes the potential on neighboring nodes, connected through conducting programmable switches, to change towards the signaling level, and their speed-up circuits in turn temporarily enforce the new level. After the temporary enforcement of the signaling level, each speed-up circuit forces its network node back to the stand-by level, for a predetermined period of time. Thus, a forced pulse away from the stand-by logic level towards the signaling level on a node quickly propagates to its connected nodes.

19 Claims, 11 Drawing Sheets

POSTCHARGED BI-DIRECTIONAL BUS REPEATER

TERNARY
POSTCHARGED
SPEED-UP
CIRCUIT

TERNARY POSTCHARGED BI-DIRECTIONAL BUS REPEATER

POSTCHARGED INTERCONNECTION SPEED-UP CIRCUIT

CROSS REFERENCE TO RELATED APPLICATIONS

This application claims priority from U.S. provisional patent application No. 60/022,552 filed Jul. 19, 1996. This application is related to U.S. Pat. No. 5,440,182, "DYNAMIC LOGIC INTERCONNECT SPEED-UP CIRCUIT", and U.S. Pat. No. 5,455,521, "SELF-TIMED INTERCONNECT SPEED-UP CIRCUIT" which are incorporated herein by reference.

BACKGROUND OF THE INVENTION

1. Field of the Invention

The present invention relates to integrated circuit (IC) technology. More specifically, the present invention pertains to fast circuits for realizing programmable interconnect architectures among circuitry on one integrated circuit, and among circuitry on different integrated circuits.

2. Prior Art

Programmable interconnect architectures are used in user-programmable arrays of logic cells, also referred to as "Field Programmable Gate Arrays (FPGAs)", as well as in dedicated programmable interconnect chips, microprocessors, digital signal processor cores, etc.

Such programmable interconnect architectures typically consist of a network of conductive nodes, programmable passive switches, and programmable or non-programmable repeater circuits. An interconnection from one conductive node to another is obtained by programming the intermediate passive switches to be conducting, and by programming each repeater circuit to be propagating and enhancing the signal from one of its terminals to another. The signal enhancement through a repeater circuit consists of driving the output with a low-impedance version of the logic signal at the input.

The repeater circuits are necessary to limit the propagation delay and the signal rise/fall time in cases where the interconnection contains many passive switches in sequence. The delay through such a network can be approximately modeled as an "RC-chain", and hence both propagation delay and rise/fall time are roughly proportional to the square of the number of switches traversed. The network of switches and repeaters can be optimized to have minimum worst case propagation delay, and an acceptable signal rise/fall time, under a given layout area constraint. The optimization consists of finding the best combination of repeater circuit sizing, switch sizing, and switch-to-repeater ratio. The switch-to-repeater ratio is the worst case number of switches between repeaters in the path of an interconnection.

The design trade-offs may be explored as follows. As the switches are made larger, their on-resistance becomes smaller, but the capacitance added to the conductive nodes becomes larger. Second order factors such as parasitic capacitance, and the non-linear voltage dependence of the on-resistance of the switches, along with the repeater sizing, must be considered to find the best switch sizing. Placing repeaters at every conductive node is possible if there is no area constraint. However, repeaters have an inherent propagation delay. When placed at every node, the repeater propagation delay dominates the total propagation delay.

In a realistic programmable interconnect architecture, a layout area constraint must be considered. In bi-directional, two-dimensional programmable interconnect architectures, such as the ones used in FPGAs, the repeater area is very large: the bi-directionality and the two-dimensionality may require a redundancy of a factor two or larger in the number of three-state buffers: not more than half the buffers, but usually fewer, are actually used when programmed. The fact that three-state buffers are employed implies large circuits and additional area overhead due to memory cells in the repeaters.

In conclusion, the area and performance of programmable bi-directional interconnect architectures may be improved efficiently by employing a bi-directional repeater circuit with a small propagation delay and a small area.

Ph.D. Dissertation "Applications of Regenerative Feedback in Integrated Circuits," by I. Dobbelaere, Stanford University, Stanford, Calif., 1995, Chapter 2, incorporated herein by reference, gives a more detailed discussion of these trade-offs.

Book "The design and analysis of VLSI circuits" by L. Glasser and D. Dobberpuhl, Addison-Wesley Publishing Company, Reading, Mass., 1985, p. 420, FIG. 8.5, shows a carry chain employing a precharge PMOS transistor and an evaluation circuit with feedback on each intermediate node of the carry chain. However, that circuit is directed to providing a short propagation delay in a dynamic logic uni-directional carry chain and it does not address the use of a delay circuits for evaluation and for postcharging in order to obtain a circuit that works independent of a clock. Finally, it does not address the use of such a circuit in a programmable interconnect architecture, and it does not address the use of such a precharge and evaluation circuit for bi-directional signal propagation.

Book "Analog VLSI and Neural Systems" by C. Mead, Chapter 12, FIG. 12.5, describes an axon repeater circuit. However, that circuit has four network nodes, is not directed to use as a single-terminal circuit for addition to intermediate nodes of an RC tree, and is not directed to use in bi-directional interconnections. Instead, it is directed to use as a stage in a unidirectional delay line using two network connections between neighboring stages.

U.S. Pat. No. 5,343,090 to R. Proebsting shows a speed enhancement technique for CMOS circuits. However, that circuit is directed towards reducing the capacitive loading in a uni-directional circuit by using a negative feedback path for postcharging a dynamic logic node, and does not address the use of a positive feedback path to enhance a transition. Furthermore, that circuit is not directed towards use for bi-directional signal propagation.

OBJECTS OF THE INVENTION

Accordingly, it is a principal object of the invention to provide a bi-directional repeater circuit with a smaller layout area and a smaller propagation delay than existing circuits, enabling the design of programmable interconnect architectures with smaller layout area, and with smaller propagation delays, than existing ones.

It is also a principal object of the invention to provide a speed-up circuit for static and dynamic logic circuits with a smaller layout area and a smaller propagation delay than existing circuits, that can be added to intermediate nodes of logic circuits in a modular fashion, and that is bi-directional.

Other objects and features of the invention will become apparent to those skilled in the art in light of the following description and drawings of the preferred embodiment.

BRIEF DESCRIPTION OF THE INVENTION

In accordance with the present invention, a speed-up circuit for use in electrically programmable interconnect architectures is disclosed. In a programmable interconnect architecture consisting of a plurality of conductive nodes interconnected by programmable passive switches, this circuit acts as a bi-directional repeater with negligible added propagation delay, and with a minimum redundancy in the number driver transistors, resulting in faster and more area efficient circuits.

In one embodiment, a plurality of postcharged speed-up circuits, each having a single network node, is connected to the intermediate nodes of a programmable interconnect architecture. Each speed-up circuit monitors the logic level on the network node. When a circuit detects a substantial change in logic level, away from the stand-by level, it temporarily enforces that change by connecting its network node to the signaling logic level. Thus, on each node, a low-impedance enhancement of the signal driving the node temporarily appears. This causes the potential on neighboring nodes, connected through conducting programmable switches, to change towards the signaling level, and their speed-up circuits in turn temporarily enforce the new level. After the temporary enforcement of the signaling level, each speed-up circuit forces its network node back to the stand-by level, for a predetermined period of time. Thus, a forced pulse away from the stand-by logic level towards the signaling level on a node quickly propagates to its connected nodes.

A preferred embodiment of the postcharged speed-up circuit in CMOS uses a high supply for the stand-by level, a low supply for the signaling level, and comprises an NMOS transistor between the network node and the low supply for regeneration, a PMOS transistor between the network node and the high supply for postcharging, and control circuitry. The control circuitry driving the NMOS transistor gate terminal is a NOR gate with one input connected to the network node and one input connected to the output of an inverting delay element that produces a delayed in-verse of the signal on the network node. The control circuitry driving the PMOS transistor gate terminal is a delayed version of the signal on the network node, obtained by adding an extra inversion to the output of the inverting delay element.

Also according to the present invention, a bi-directional two-terminal bus repeater, compatible with static and dynamic logic, is disclosed. This bi-directional bus repeater has two terminals connected to intermediate nodes of a programmable interconnect architecture. The circuit is initially in the stand-by state, where it monitors the logic level on its terminals. When the circuit detects a substantial change in logic level, away from the stand-by level, it temporarily enforces that change by connecting both of its terminals to the signaling level corresponding to the detected change. After the temporary enforcement of the new level, the repeater forces both of its terminals back the stand-by level, for a predetermined amount of time.

A ternary version of the postcharged speed-up circuit has a network node, a stand-by level supply node, a high signaling level supply node, and a low signaling level supply node. Excursions on the network node from a stand-by level towards either the high or the low signaling level are detected and temporarily enforced, after which the network node is temporarily forced back to the stand-by level.

Similarly, a ternary version of the bi-directional two-terminal bus repeater is disclosed.

DETAILED DESCRIPTION OF SPECIFIC EMBODIMENTS

Throughout this description, the same labels have been used for like elements.

Figure 1:
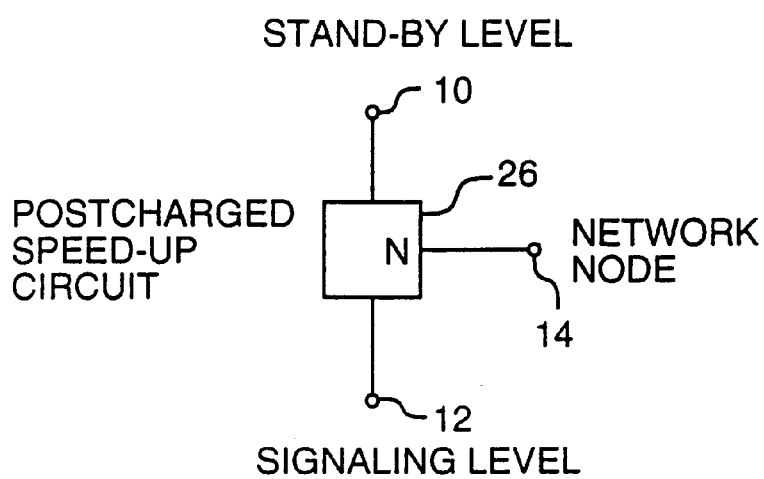
FIG. 1 shows a block diagram of an embodiment of a postcharged speed-up circuit according to the present invention.

FIG. 1 shows a block diagram of a speed-up circuit 26 according to the present invention, connected to a network node 14, a stand-by supply node 10 at a stand-by level, and a signaling supply node 12 at a signaling level, that is substantially different from stand-by level 10 in order to be logically distinguishable.

The operation of speed-up circuit 26 of FIG. 1 is as follows. Speed-up circuit 26 has three internal states. In a first state, called the stand-by state, speed-up circuit 26 provides a high-impedance equivalent to an open circuit at network node 14. In addition, while in the stand-by state, speed-up circuit 26 monitors the logic level on network node 14. If the logic level on network node 14 is forced, by an external circuit, not shown in FIG. 1, to a level change exceeding a predetermined threshold, from an initial stand-by level towards said signaling level, speed-up circuit 26 goes temporarily to a second state, called the regenerative state, for a first predetermined period of time. In the regenerative state, speed-up circuit 26 provides a low-impedance connection between network node 14 and the signaling level on signaling supply node 12.

Immediately following the first predetermined period of time in which speed-up circuit 26 is in the regenerative state, speed-up circuit 26 temporarily goes to a third state, referred to as the postcharge state, for a second predetermined period of time. In the postcharge state, speed-up circuit 26 provides a low-impedance connection between network 14 and the stand-by level on stand-by supply node 10.

After the second predetermined period of time, speed-up circuit 26 returns to the stand-by state, in which it provides a high-impedance equivalent to an open circuit at network node 14.

Hence, speed-up circuit 26 is capable of regenerating a monostable pulse to a signaling logic level, when triggered by external circuitry.

Figure 2:
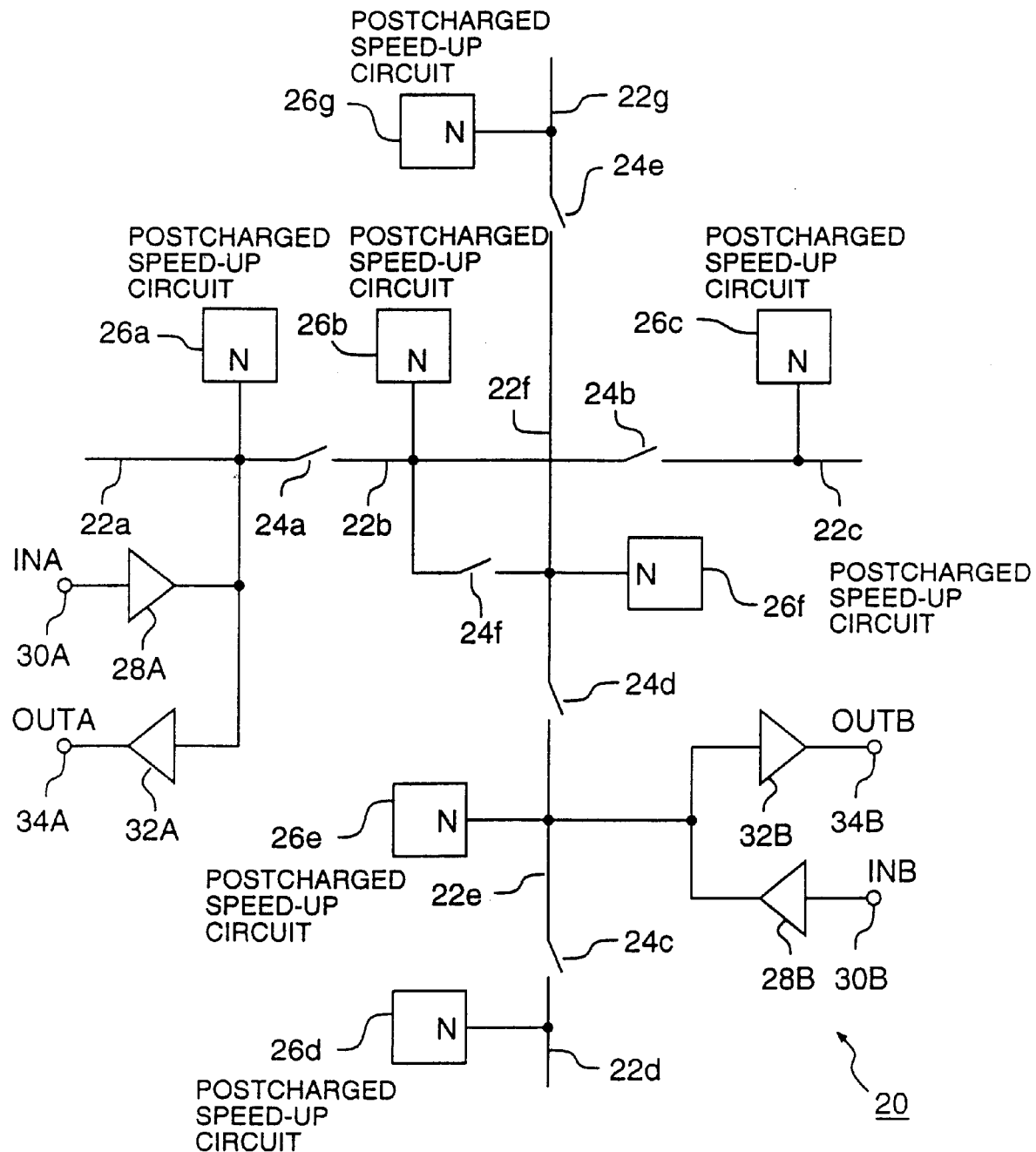
FIG. 2 shows an illustrative embodiment of a programmable interconnect architecture according to the present invention.

FIG. 2 depicts an illustrative embodiment of a programmable interconnect architecture 20 consisting of seven conductive nodes 22a–22g interconnected by six programmable switches 24a–24f, two sending buffers 28A and 28B for sending signals to programmable interconnect architecture 20, an input node 30A, also referred to as INA, an input node 30B, also referred to as INB, two receiving buffers 32A and 32B for receiving signals from programmable interconnect architecture 20, an output node 34A, also referred to as OUTA, an output node 34B, also referred to as OUTB, and seven speed-up circuits 26a–26g according to the present invention.

Speed-up circuits 26a–26g are embodiments of the post-charged speed-up circuit 26 of FIG. 1. For clarity, the connections to to the stand-by supply node and to the signaling supply node of speed-up circuits 26a–26g have been omitted in FIG. 2.

Each of programmable switches 24a–24f has two programming states. In a first programming state, further referred to as the non-conducting state, a high impedance is present between the two terminals. In a second programming state, further referred to as the conducting state, a low-impedance bi-directional electrical interconnection is realized between the two terminals. Many different embodiments of programmable switches 24a–24f are known, such as: an NMOS/PMOS pass transistor pair with programmable element; an NMOS pass transistor driven by a programmable element with a high gate voltage; anti-fuses; etc.

Sending buffers 28A–28B receive their inputs from external circuitry, not shown in FIG. 2, and the outputs of receiving buffers 32A–32B drive external circuitry. Sending and receiving buffers 28A–28B and 32A–32B are capable of buffering signals at the stand-by level and at the signaling level of postcharged speed-up circuits 26a–26f. The inputs NA and NB to sending buffers 28A–28B, and the outputs of receiving buffers 32A–32B may be outputs, and inputs, respectively, to self-timed circuitry as known to those skilled in the art.

Speed-up circuits 26a–26f may be used to quickly, in a bi-directional manner, transmit monostable pulses across a programmable interconnect architecture of conductive leads interconnected by passive switches. As was explained earlier, programmable switches 24a through 24f may be individually programmed to be either in the conducting or the non-conducting state. Assume now that programmable switches 24a, 24f and 24d are programmed to the conducting state, while the other programmable switches 24b, 24c, and 24e are programmed to the non-conducting state. This establishes a conductive path from conductive lead 22a, through conductive leads 22b and 22f, to conductive lead 22e, in which each of programmable switches 24a, 24f and 24d can be modeled by its on-resistance, and each of conductive leads 22a, 22b, 22f, and 22e can be modeled by the lumped capacitance contribution of each conductive lead and the input and output capacitances of the circuits connected to it. Assume that initially, the input to sending buffer 28A is at the stand-by level, and hence a stand-by level is also present at its output on conductive lead 22a. Also assume that initially, a stand-by level is present on all conductive leads 22a through 22g, and that all speed-up circuits 26a through 26g are in the stand-by state and provide a high impedance at their network nodes N. If now the first edge of a pulse from the stand-by level to the signaling level is applied at the input of sending buffer 28A, a level transition from the stand-by level to the signaling level will appear at the output of buffer 28A, on conductive lead 22a. When the level change on conductive lead 22a exceeds a predetermined threshold, speed-up circuit 26a temporarily goes to its regenerative state, where it provides a low-impedance connection between conductive lead 22a and its signaling supply node. Meanwhile, the level on conductive lead 22b is being changed, through a resistive path through programmable switch 24a, and on, partly through buffer 28A, partly through network terminal N of speed-up circuit 26a. Hence, in turn, if speed-up circuit 26b detects a change exceeding a certain threshold on conductive lead 22b, it temporarily goes to its regenerative state, and enforces a signaling level at its network terminal N. Meanwhile, the levels on conductive leads 22f and 22e are being changed in a similar manner, and speed-up circuits 26f and 26e temporarily go to the regenerative state in turn, and start enforcing a signaling level. Finally, the level on conductive lead 22e changes to the signaling level. The signaling level on conductive lead 22e is propagated through output buffer 32B to output node 34B. Hence, a transition on input node 30A quickly propagates through programmable interconnect architecture 20 and appears on output node 34B.

After some time, the second edge of the pulse is applied to input node 30A. This causes the output of input buffer 28A to establish a low impedance interconnection to the stand-by level.

After said first predetermined period of time, each of speed-up circuits 26a, 26b, 26f and 26e in turn goes to the postcharge state, each connecting their network nodes N to the stand-by supply node for said second predetermined period of time, as described for the operation of embodiment 26 of FIG. 1.

Now referring to FIG. 2 again, after said second predetermined period of time, each of speed-up circuits 26a, 26b, 26f and 26e turns to the stand-by state, providing a high impedance at their network nodes N. In this state, conductive leads 22a, 22b, 22f and 22e stay at the stand-by level, due to capacitive charge storage and due to the stand-by level output of buffer 28A.

Hence, pulses at input node 30A are quickly propagated through programmable interconnect architecture 20 and appear on output node 34A. Conversely, pulses at input node 30B are quickly propagated through programmable interconnect architecture 20 and appear on output node 34B. Hence, a circuit style for providing fast, bi-directional interconnections, compatible with static, dynamic and self-timed logic, is obtained. It can be shown that the delay through such a network is approximately a linear function of the number of switches traversed. Many variations are possible. It is not necessary to place speed-up circuits at every conductive lead. Alternatively, several speed-up circuits may be placed at different positions along a single conductive lead.

The input buffers to the programmable interconnect architecture may contain logic in order to prevent ratioed logic fighting between the outputs of the input buffers and post-charged speed-up circuits connected to the conductive nodes of the interconnect architecture.

It is clear to those skilled in the art that weak feedback circuitry, similar to the weak feedback circuitry customary in Domino logic, can be added to prevent floating nodes while the speed-up circuits are in the stand-by state. It is also clear that there is an area advantage in re-using internal signals of the speed-up circuits for generating the control of such weak feedback circuits.

Programmable interconnect architecture 20 can be used for the propagation of single pulses or pairs of complementary pulses, among clocked logic circuits or self-timed logic circuits. It can also be used for the propagation of frequency modulated pulse trains among analog circuits.

Figure 3A:
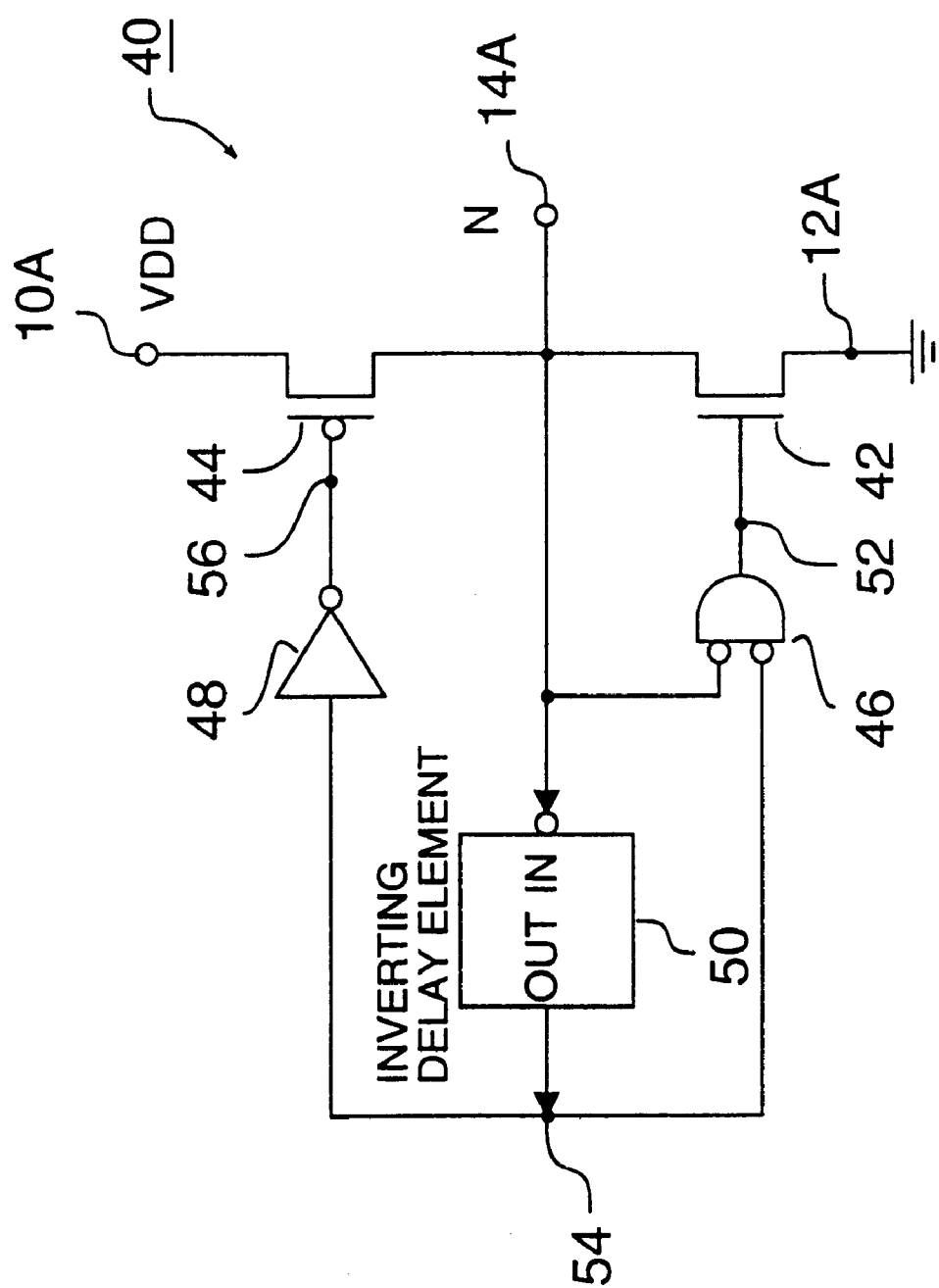
FIGS. 3A and 3B show the schematics of embodiments of the speed-up circuit in FIG. 1.

FIG. 3A shows the schematic of an embodiment 40 of a speed-up circuit according to the present invention. Embodiment 40 comprises a stand-by supply node 10A, a signaling supply node 12A, and a network node 14A. Embodiment 40 further comprises three intermediate nodes 52, 54, and 56, an NMOS transistor 42, a PMOS transistor 44, a logic NOR gate 46, an inverter 48, and an inverting delay element 50. Inverting delay element 50 has its input connected to network node 14A and its output connected to intermediate node 54. Logic NOR gate 46 has its output connected to intermediate node 52, has its first input connected to network node 14A, and has its second input connected to intermediate node 54. Inverter 48 has its output connected to intermediate node 56 and its input connected to intermediate node 54. PMOS transistor 44 has its gate connected to intermediate node 56, has its first current electrode connected to stand-by supply node 10A, and has its second current electrode connected to network node 14A. NMOS transistor 42 has its gate connected to intermediate node 52, has its first current electrode connected to signaling supply node 12A, and has its second current electrode connected to network node 14A.

In embodiment 40 shown in FIG. 3A, the stand-by supply level on stand-by supply node 10A is the positive supply for the circuitry and equals a logic high level, and the signaling supply level on signaling supply node 12A is the negative supply for the circuitry and equals a logic low level. The operation of embodiment 40 is as follows. When a high level or stand-by level is present on network node 14A for a sufficiently long period of time, a low level is present at the output of inverting delay element 50, on intermediate node 54. Hence, logic NOR gate 46 has one input at a high level, on network node 14A, and one input at a low level, on intermediate node 54, and hence its output, on intermediate node 52, is low. Therefore, NMOS transistor 42 is off and provides a high impedance equivalent to an open circuit between network node 14A and signaling supply node 12A. Also, the output of inverter 48, on intermediate node 56, is at a high level. Therefore, PMOS transistor 44 is off and provides a low impedance equivalent to an open circuit between network node 14A and stand-by supply node 10A. The speed-up circuit is hence in a first state, referred to as the "stand-by" state, in which it provides a high impedance at its network node 14A while monitoring the logic level.

Assume now that the logic level on network node 14A is pulled low by an external circuit, not shown in FIG. 3A, to a level below the gate threshold of logic NOR gate 46. The output of logic NOR gate 46, on intermediate node 52, goes high, and NMOS transistor 42 is turned on, creating a local conductive path between network node 14A and signaling supply node 12A. As a result, the transition on network node 14A from the stand-by level to the signaling level, which was initiated by an external circuit, is locally enhanced by embodiment 40 of the postcharged speed-up circuit according to the present invention. This is referred to as the "regenerative" state of the speed-up circuit.

Eventually, the falling transition on network node 14A propagates to the output of inverting delay element 50 and causes its output, appearing on intermediate node 54, to go from a low level to a high level. This in turn causes the output of logic NOR gate 46 to return to a low level, turning off NMOS transistor 42. This marks the end of a first predetermined period of time, in which the speed-up circuit is in the "regenerative" state, after a level change has been detected on network node 14A from the stand-by level towards the signaling level, past the threshold of logic NOR gate 46.

Concurrently, the rising transition on intermediate node 54 propagates through inverter 48 and causes its output to go from an initial high level to a low level, turning on PMOS transistor 44, and creating a-local conductive path between network node 14A and stand-by supply node 10A. This marks the start of a second predetermined period of time, in which the speed-up circuit is in the "postcharge" state, during which the level on network node 14A is postcharged to the stand-by level.

We assume for now that the external circuit causing the initial transition from the stand-by level towards the signaling level on network node 14A is connected to network node 14A through a sufficiently high impedance compared to the on-resistance of PMOS transistor 44, such that when embodiment 40 goes to the postcharge state, it effectively brings network node 14A to a high logic level should there be fighting between PMOS transistor 44 and a low level on said external circuit. It is also assumed that the level provided by said external circuit returns to a stand-by level before the end of said second period of time during which the speed-up circuit is in the postcharge state.

The transition from a signaling or low level to a stand-by or high level on network node 14A ensures that the output of logic NOR gate 46, on intermediate node 52, remains at a low level, such that NMOS transistor 42 remains off. Said rising transition on network node 14A also propagates through inverting delay element 50, causing a falling transition on intermediate node 54, and further propagates through inverter 48, causing a rising transition on intermediate node 56. This rising transition on intermediate node 56 turns off PMOS transistor 44. This marks the end of the second predetermined period of time, during which embodiment 40 is in the postcharge state. Embodiment 40 of the postcharged speed-up circuit now is back in its initial stand-by state.

In embodiment 40 of FIG. 3A, weak feedback circuitry to prevent network node 14A from floating while embodiment 40 is in the stand-by mode can consist of a simple inverter with its input connected to network node 14A, and its output connected to the gate of a weak PMOS pull-up transistor, that has its first current terminal connected to stand-by supply node 10A, and its second current terminal connected to network node 14A, as known in the art. It is clear that said simple inverter can be a part of inverting delay element 50.

It is clear that inverting delay element 50 can use known techniques such as the use of an on-chip bias voltage for obtaining a desired delay as a function of environmental and technology parameters.

Figure 3B:
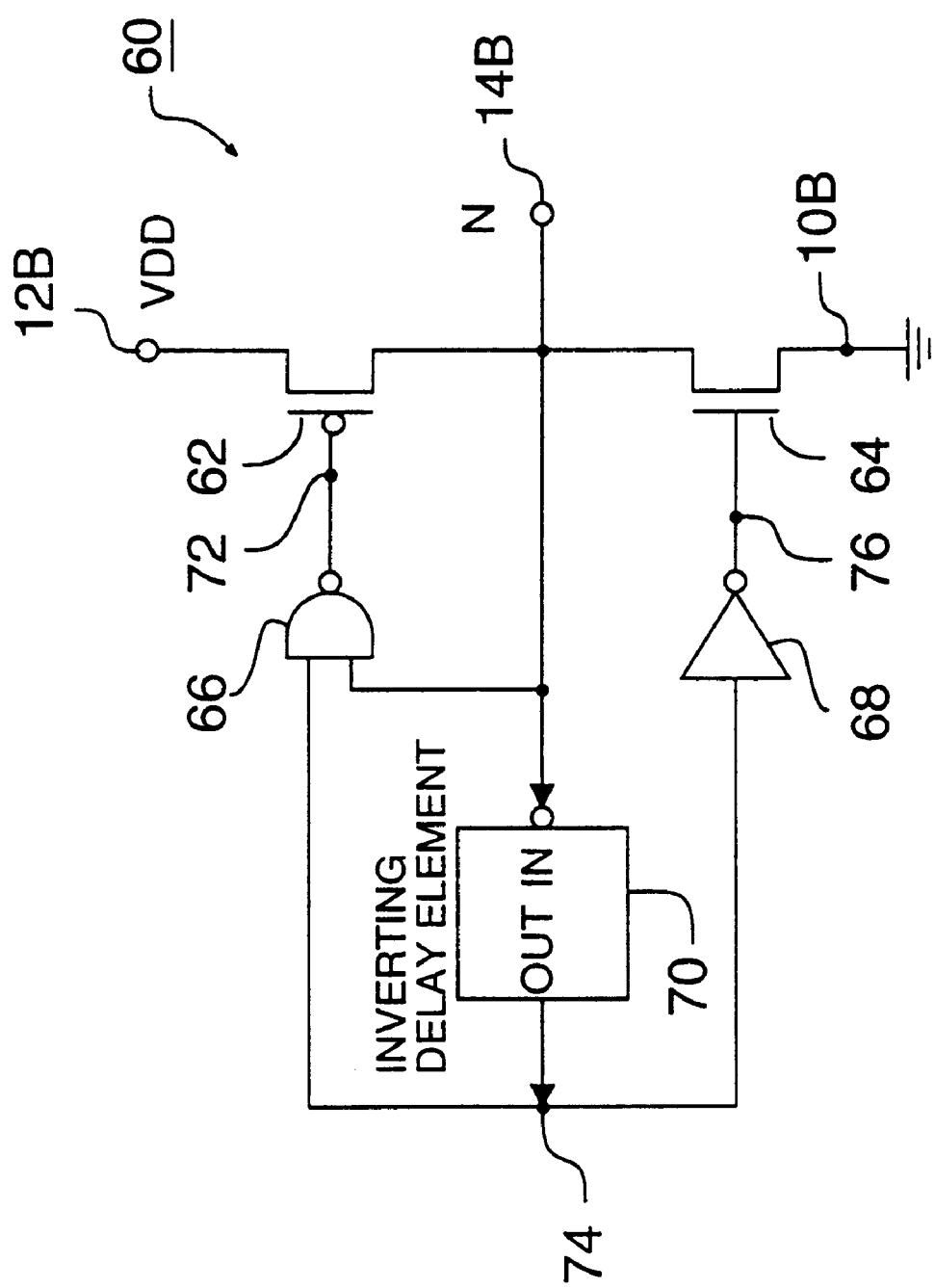

FIG. 3B shows the schematic of an embodiment 60 of a speed-up circuit according to the present invention. Embodiment 60 comprises a stand-by supply node 10B, a signaling supply node 12B, and a network node 14B. Embodiment 60 further comprises three intermediate nodes 72, 74, and 76, a PMOS transistor 62, an NMOS transistor 64, a logic NAND gate 66, an inverter 68, and an inverting delay element 70. Inverting delay element 70 has its input connected to network node 14B and its output connected to intermediate node 74. Logic NAND gate 66 has its output connected to intermediate node 72, has its first input connected to network node 14B, and has its second input connected to intermediate node 74. Inverter 68 has its output connected to intermediate node 76 and its input connected to intermediate node 74. NMOS transistor 64 has its gate connected to intermediate node 76, has its first current electrode connected to stand-by supply node 10B, and has its second current electrode connected to network node 14B. PMOS transistor 62 has its gate connected to intermediate node 72, has its first current electrode connected to signaling supply node 12B, and has its second current electrode connected to network node 14B.

In embodiment 60 of a postcharged speed-up circuit according to the present invention, shown in FIG. 3B, the stand-by supply level on stand-by supply node 10A is the negative supply for the circuitry and equals a logic low level, and the signaling supply level on signaling supply node 12A is the positive supply for the circuitry and equals a logic high level. The operation of embodiment 60 is complementary to the operation of embodiment 40, and is as follows. When a low level or stand-by level is present on network node 14B for a sufficiently long period of time, a high level is present at the output of inverting delay element 70, on intermediate node 74. Hence, logic NAND gate 66 has one input at a low level, on network node 14B, and one input at a high level, on intermediate node 74, and hence its output, on intermediate node 72, is high. Therefore, PMOS transistor 62 is off and provides a high impedance equivalent to an open circuit between network node 14B and signaling supply node 12B. Also, the output of inverter 68, on intermediate node 76, is at a low level. Therefore, NMOS transistor 64 is off and provides a low impedance equivalent to an open circuit between network node 14B and stand-by supply node 10B. The speed-up circuit is hence in a first state, referred to as the "stand-by" state, in which it provides a high impedance at its network node 14B while monitoring the logic level.

Assume now that the logic level on network node 14B is pulled high by an external circuit, not shown in FIG. 3B, to a level above the gate threshold of logic NAND gate 66. The output of logic NAND gate 66, on intermediate node 72, goes low, and PMOS transistor 62 is turned on, creating a local conductive path between network node 14B and signaling supply node 12B. As a result, the transition on network node 14B from the stand-by level to the signaling level, which was initiated by an external circuit, is locally enhanced by embodiment 60 of the postcharged speed-up circuit according to the present invention. This is referred to as the "regenerative" state of the speed-up circuit.

Eventually, the rising transition on network node 14B propagates to the output of inverting delay element 70 and causes its output, appearing on intermediate node 74, to go from a high level to a low level. This in turn causes the output of logic NAND gate 66 to return to a high level, turning off PMOS transistor 62. This marks the end of a first predetermined period of time, in which the speed-up circuit is in the "regenerative" state, after a level change has been detected on network node 14B from the stand-by level towards the signaling level, past the threshold of logic NAND gate 66.

Concurrently, the falling transition on intermediate node 74 propagates through inverter 68 and causes its output to go from an initial low level to a high level, turning on NMOS transistor 64, and creating a local conductive path between network node 14B and stand-by supply node 10B. This marks the start of a second predetermined period of time, in which the speed-up circuit is in the "postcharge" state, during which the level on network node 14B is postcharged to the stand-by level.

We assume for now that the external circuit causing the initial transition from the stand-by level towards the signaling level on network node 14B is connected to network node 14B through a sufficiently high impedance compared to the on-resistance of NMOS transistor 64, such that when embodiment 60 goes to the postcharge state, it effectively brings network node 14B to a low logic level should there be fighting between NMOS transistor 64 and and a high level on said external circuit. It is also assumed that the level provided by said external circuit returns to a stand-by level before the end of said second period of time during which the speed-up circuit is in the postcharge state.

The transition from a signaling or high level to a stand-by or low level on network node 14B ensures that the output of logic NAND gate 66, on intermediate node 72, remains at a high level, such that NMOS transistor 62 remains off. Said falling transition on network node 14B also propagates through inverting delay element 70, causing a rising transition on intermediate node 74, and further propagates through inverter 68, causing a falling transition on intermediate node 76. This falling transition on intermediate node 76 turns off NMOS transistor 64. This marks the end of the second predetermined period of time, during which embodiment 60 is in the postcharge state. Embodiment 60 of the postcharged speed-up circuit now is back in its initial stand-by state.

Figure 4:
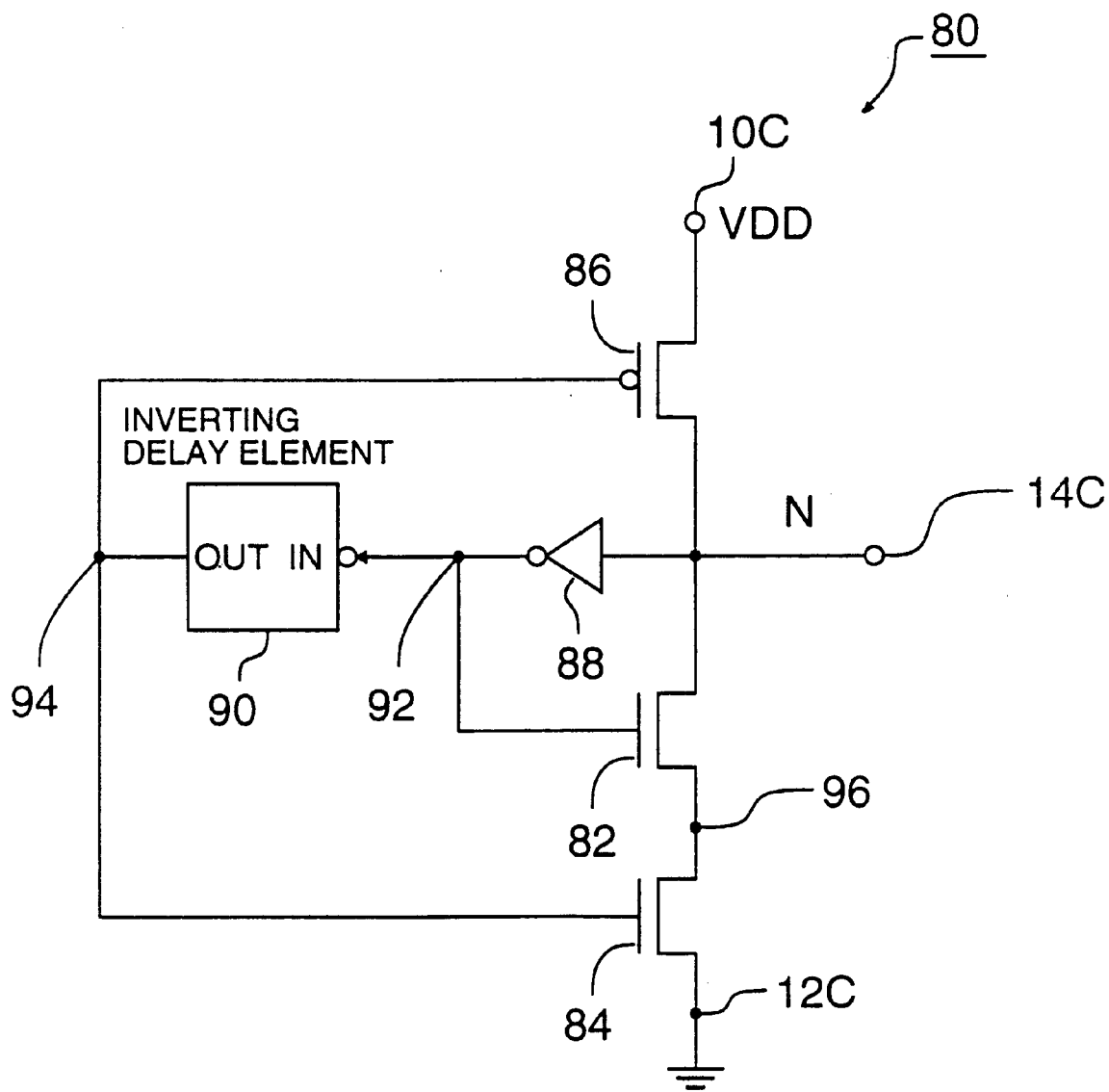
FIG. 4 shows the schematics of embodiments of the speed-up circuit in FIG. 1.

FIG. 4 shows the schematic of an embodiment 80 of a speed-up circuit according to the present invention. Embodiment 80 comprises a stand-by supply node 10C, a signaling supply node 12C, and a network node 14C. Embodiment 80 further comprises three intermediate nodes 92, 94, and 96, two NMOS transistors 82 and 84, a PMOS transistor 86, an inverter 88 and an inverting delay element 90. Inverting delay element 90 has its input connected to intermediate node 92 and its output connected to intermediate node 94. Inverter 88 has its output connected to intermediate node 92 and its input connected to intermediate node 14C. PMOS transistor 86 has its gate connected to intermediate node 94, has its first current electrode connected to stand-by supply node 10C and has its second current electrode connected to network node 14C. NMOS transistor 82 has its gate connected to intermediate node 92, has its first current electrode connected to intermediate node 96, and has its second current electrode connected to network node 14C. NMOS transistor 84 has its gate connected to intermediate node 94, has its first current electrode connected to signaling supply node 12C, and has its second current electrode connected to intermediate node 96.

In embodiment 80 shown in FIG. 4, the stand-by supply level on stand-by supply node 10C is the positive supply for the circuitry and equals a logic high level, and the signaling supply level on signaling supply node 12C is the negative supply for the circuitry and equals a logic low level. The operation of embodiment 80 is as follows. When a high level or stand-by level is present on network node 14C for a sufficiently long period of time, a low level is present at the output of inverter 88, on intermediate node 92, and a high level is present at the output of inverting delay element 90, on intermediate node 94. Hence, NMOS transistor 84 is on, and NMOS transistor 82 is off, and there is no conductive path between network node 14C and signaling supply node 12C, through NMOS transistors 82 and 84 and through intermediate node 96. Also, since a high level is present on intermediate node 94, PMOS transistor 86 is off and a high impedance equivalent to an open circuit is present between network node 14C and stand-by supply node 10C. Embodiment 80 of the postcharged speed-up circuit is hence in a first state, referred to as the "stand-by" state, in which it provides a high impedance at its network node 14C while monitoring the logic level.

Assume now that the logic level on network node 14C is pulled low by an external circuit, not shown in FIG. 4, to a level below the gate threshold of inverter 88. The output of inverter 88, on intermediate node 92, goes high, and NMOS transistor 82 is turned on, creating a local conductive path between network node 14C and signaling supply node 12C, through NMOS transistors 82 and 84 and through intermediate node 96. As a result, the transition on network node 14C from the stand-by level to the signaling level, which was initiated by an external circuit, is locally enhanced by embodiment 80 of the postcharged speed-up circuit according to the present invention. This is referred to as the "regenerative" state of the speed-up circuit.

Eventually, the rising transition on intermediate node 92 to the output of inverting delay element 90 and causes its output, appearing on intermediate node 94, to go from a high level to a low level, turning off NMOS transistor 84, and turning off the conductive path between network node 14C and signaling supply node 12C. This marks the end of a first predetermined period of time, in which the speed-up circuit is in the "regenerative" state, after a level change has been detected on network node 14C from the stand-by level towards the signaling level, past the threshold of inverter 88.

Concurrently, the falling transition on intermediate node 94 turns on PMOS transistor 44, creating a local conductive path between network node 14C and stand-by supply node 10C. This marks the start of a second predetermined period of time, in which the speed-up circuit is in the "postcharge" state, during which the level on network node 14C is postcharged to the stand-by level.

We assume for now also that the external circuit causing the initial transition from the stand-by level towards the signaling level on network node 14C is connected to network node 14C through a sufficiently high impedance compared to the on-resistance of PMOS transistor 86, such that when embodiment 80 goes to the postcharge state, it effectively brings network node 14C to a high logic level should there be fighting between PMOS transistor 86 and and a low level on said external circuit. It is also assumed that the level provided by said external circuit returns to a stand-by level before the end of said second period of time during which the speed-up circuit is in the postcharge state.

The transition from a signaling or low level to a stand-by or high level on network node 14C ensures that the output inverter 88, on intermediate node 92, goes to a low level, such that NMOS transistor 82 turns off. This ensures that the conductive path between network node 14C and signaling supply node 12C remains off. Said falling transition on intermediate node further propagates through inverting delay element 90, causing a rising transition on intermediate node 94, turning on NMOS transistor 84, and turning off PMOS transistor 86. This marks the end of the second predetermined period of time, during which embodiment 80 is in the postcharge state. Embodiment 80 of the postcharged speed-up circuit now is back in its initial stand-by state.

It is clear that the logic complement of embodiment 80 of FIG. 4 can be constructed, using a logic low level as a stand-by level, and a logic high level as a signaling level. In the complementary structure of embodiment 80 of FIG. 4, NMOS transistors are replaced by PMOS transistors and vice-versa, and high and low levels are switched.

Figure 5:
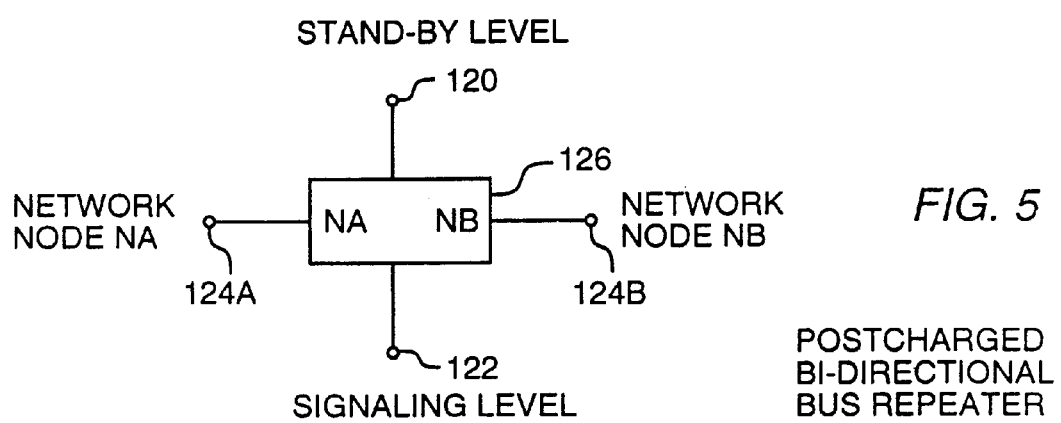
FIG. 5 shows a block diagram of an embodiment of a postcharged bi-directional bus repeater according to the present invention.

FIG. 5 shows a block diagram of a postcharged bi-directional bus repeater 126 according to the present invention, connected to a network nodes 124A and 124B, a stand-by supply node 120 at a stand-by level, and a signaling supply node 122 at a signaling level, that is substantially different from stand-by level 120 in order to be logically distinguishable.

The operation of bus repeater 126 of FIG. 5 is as follows. Bus repeater 126 has three internal states. In a first state, called the stand-by state, bus repeater 126 provides a high-impedance equivalent to an open circuit at network nodes 124A and 124B. In addition, while in the stand-by state, bus repeater 126 monitors the logic level on network nodes 124A and 124B. If the logic level on either of network nodes 124A or 124B is forced, by an external circuit, not shown in FIG. 5, to a level change exceeding a predetermined threshold, from an initial stand-by level towards said signaling level, bus repeater 126 goes temporarily to a second state, called the regenerative state, for a first predetermined period of time. In the regenerative state, bus repeater 126 provides a low-impedance connection between network node 124A and the signaling level on signaling supply node 12, and between network node 124B and the signaling level on signaling supply node 12, respectively.

Immediately following the first predetermined period of time in which bus repeater 126 is in the regenerative state, bus repeater 126 temporarily goes to a third state, referred to as the postcharge state, for a second predetermined period of time. In the postcharge state, bus repeater 126 provides a low-impedance connection between network 124A and the stand-by level on stand-by supply node 10, and between network 124B and the stand-by level on stand-by supply node 10, respectively.

After the second predetermined period of time, bus repeater 126 returns to the stand-by state, in which it provides a high-impedance equivalent to an open circuit at both network nodes 124A and 124B.

Hence, bus repeater 126 is capable of regenerating a monostable pulse to a signaling logic level on either of its network nodes when triggered by external circuitry, and is capable of copying that monostable pulse onto its other network node.

It is clear that this principle can be extended to a bus repeater with more than two network nodes.

Figure 6:
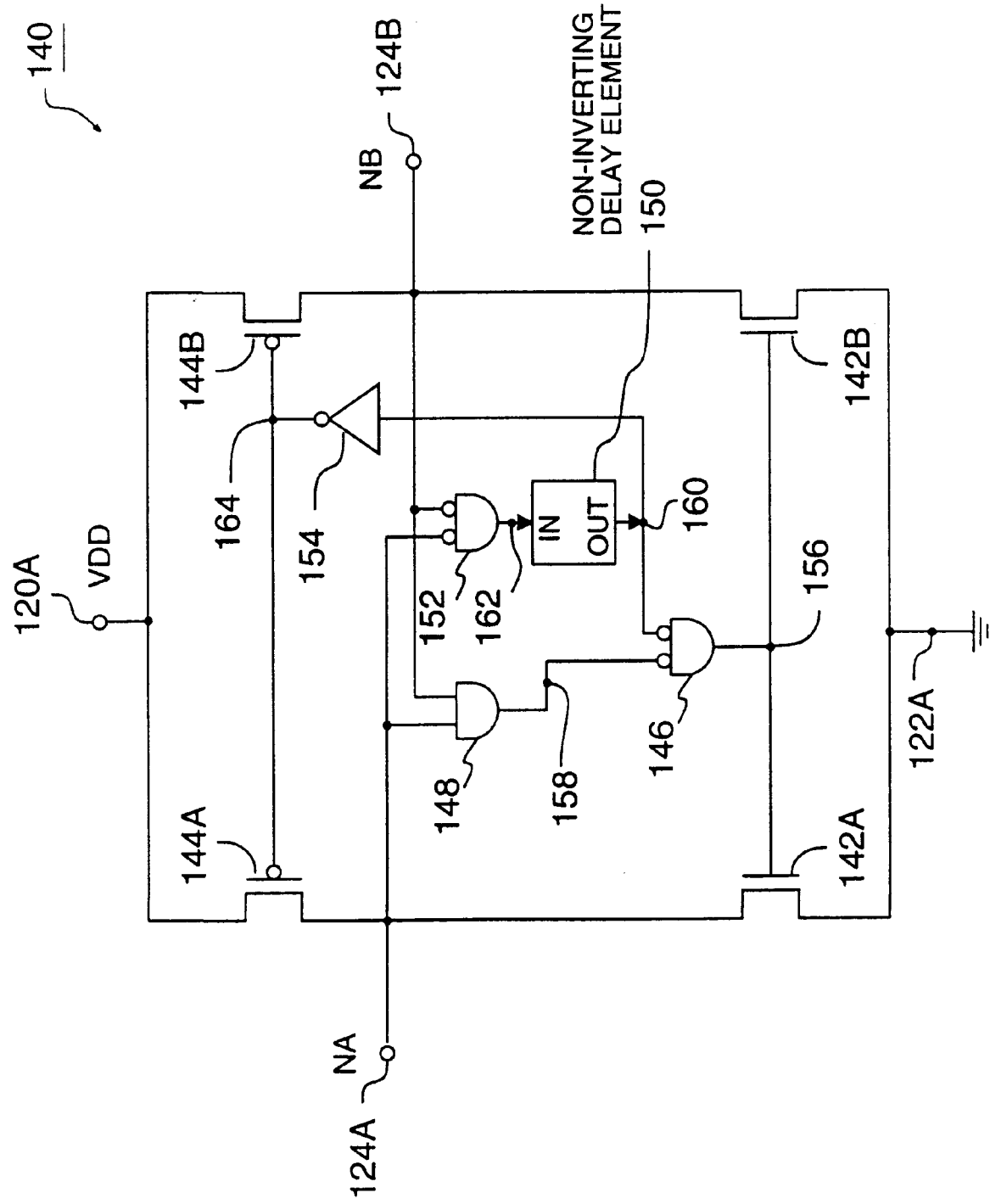
FIG. 6 shows the schematic of an embodiment of the bi-directional bus repeater in FIG. 5.

FIG. 6 shows the schematic of an embodiment 140 of a bi-directional bus repeater according to the present invention. Embodiment 140 comprises a stand-by supply node 120A, a signaling supply node 122A, and two network nodes 124A and 124B. Embodiment 140 further comprises five intermediate nodes 156, 158, 160, 162, and 164, two NMOS transistors 142A and 142B, two PMOS transistors 144A and 144B, two logic NOR gates 146 and 152, a logic AND gate 148, an inverter 154, and an inverting delay element 150. Inverting delay element 150 has its input connected to intermediate node 162 and its output connected to intermediate node 160. Logic NOR gate 152 has its output connected to intermediate node 162, has its first input connected to network node 124A, and has its second input connected to network node 124B. Logic AND gate 148 has its output connected to intermediate node 158, has its first input connected to network node 124A, and has its second input connected to network node 124B. Logic NOR gate 146 has its output connected to intermediate node 156, has its first input connected to intermediate node 158, and has its second input connected to intermediate node 160. Inverter 154 has its output connected to intermediate node 164 and its input connected to intermediate node 160. PMOS transistor 144A has its gate connected to intermediate node 164, has its first current electrode connected to stand-by supply node 120A, and has its second current electrode connected to network node 124A. PMOS transistor 144B has its gate connected to intermediate node 164, has its first current electrode connected to stand-by supply node 120Aa, and has its second current electrode connected to network node 124B. NMOS transistor 142A has its gate connected to intermediate node 156, has its first current electrode connected to signaling supply node 122A, and has its second current electrode connected to network node 124A. NMOS transistor 142B has its gate connected to intermediate node 156, has its first current electrode connected to signaling supply node 122A, and has its second current electrode connected to network node 124B.

It is clear that logic AND gate 148 and logic NOR gate 146 may be implemented as a single logic AND-OR-INVERT gate when implemented in CMOS logic.

In embodiment 140 of a postcharged bi-directional bus repeater, shown in FIG. 6, the stand-by supply level on stand-by supply node 120A is the positive supply for the circuitry and equals a logic high level, and the signaling supply level on signaling supply node 122A is the negative supply for the circuitry and equals a logic low level. The operation of embodiment 140 is as follows. When a high level or stand-by level is present on both network nodes 124A and 124B, for a sufficiently long period of time, a low level is present at the output of logic NOR gate 152, on intermediate node 162, a low level is present at the output of non-inverting delay element 150, on intermediate node 160, a high level is present at the output of logic AND gate 148, on intermediate node 158, and a low level is present at the output of logic NOR gate 146, on intermediate node 156. As a result, both NMOS transistors 142A and 142B are turned off and there is no conductive path between network node 124A and signaling supply node 122A, or between network node 124B and signaling supply node 122A, respectively. Also, since there is a low level on intermediate node 160, a high level is present at the output of inverter 154, on intermediate node 164. This causes both PMOS transistors 144A and 144B to be turned off, and there is no conductive path between network node 124A and stand-by supply node 120A, or between network node 124B and stand-by supply node 120A, respectively. Embodiment 140 of the postcharged bi-directional bus repeater is hence in a first state, referred to as the "stand-by" state, in which it provides a high impedance at both network nodes 124A and 124B while monitoring the logic level.

Assume now that the logic level on network node 124A is pulled low by an external circuit, not shown in FIG. 6, to a level below the gate threshold of AND gate 148, causing its output, on intermediate node 158, to go low. The output of logic NOR gate 146, on intermediate node 156, goes high, and both NMOS transistors 142A and 142B are turned on, creating local conductive paths between network node 124A and signaling supply node 122A, and between network node 124A and signaling supply node 122A, respectively. As a result, the transition on network node 124A from the stand-by level to the signaling level, which was initiated by an external circuit, is locally enhanced by embodiment 140 of the postcharged bi-directional bus repeater according to the present invention. In addition, the falling transition on network node 124A is replicated on network node 124B. The postcharged bi-directional bus repeater is now in the "regenerative" state.

Eventually, the falling transition on network node 124A and its copy on network node 124B both propagate to the output of logic NOR gate 152, causing a rising transition at its output, on intermediate node 162. This rising transition on intermediate node 162 is further propagated through non-inverting delay element 150 and eventually causes a rising transition at its output on intermediate node 160. This in turn causes the output of logic NOR gate 146 to return to a low level, turning off both NMOS transistor 142A and 142B. This marks the end of a first predetermined period of time, in which the postcharged bi-directional bus repeater is in the "regenerative" state, after a level change has been detected on either of network nodes 124A and 124B from the stand-by level towards the signaling level, past the threshold of logic AND gate 148.

Concurrently, the rising transition on intermediate node 160 propagates through inverter 154 and causes its output to go from an initial high level to a low level, turning on both PMOS transistors 144A and 144B, and creating local conductive paths between network node 124A and stand-by supply node 120A, and between network node 124B and stand-by supply node 120A, respectively. This marks the start of a second predetermined period of time, in which the speed-up circuit is in the "postcharge" state, during which the level on network nodes 124A and 124B is postcharged to the stand-by level.

We assume for now that the external circuit causing the initial transition from the stand-by level towards the signaling level on network node 124A is connected to network node 124A through a sufficiently high impedance compared to the on-resistance of PMOS transistor 144A, such that when embodiment 140 goes to the postcharge state, it effectively brings network node 124A to a high logic level should there be fighting between PMOS transistor 144A and and a low level on said external circuit. It is also assumed that the level provided by said external circuit returns to a stand-by level before the end of said second period of time during which the speed-up circuit is in the postcharge state.

The transition from a signaling or low level to a stand-by or high level on network node 124A ensures that the output of logic AND gate 148, on intermediate node 158, goes to a high level, and that as a result the output of logic NOR gate 146, on intermediate node 156, remains at a low level, such that NMOS transistors 142A and 142B remain off. Said rising transition on network nodes 124A and 124B also propagates through logic NOR gate 152, causing a falling transition intermediate node 162, which propagates through non-inverting delay element 150, causing a falling transition on intermediate node 160. As a result, the output of inverter 154 goes to a high level, turning off PMOS transistors 144A and 144B. This marks the end of the second predetermined period of time, during which embodiment 140 is in the postcharge state. Embodiment 140 of the postcharged speed-up circuit now is back in its initial stand-by state.

Figure 7:
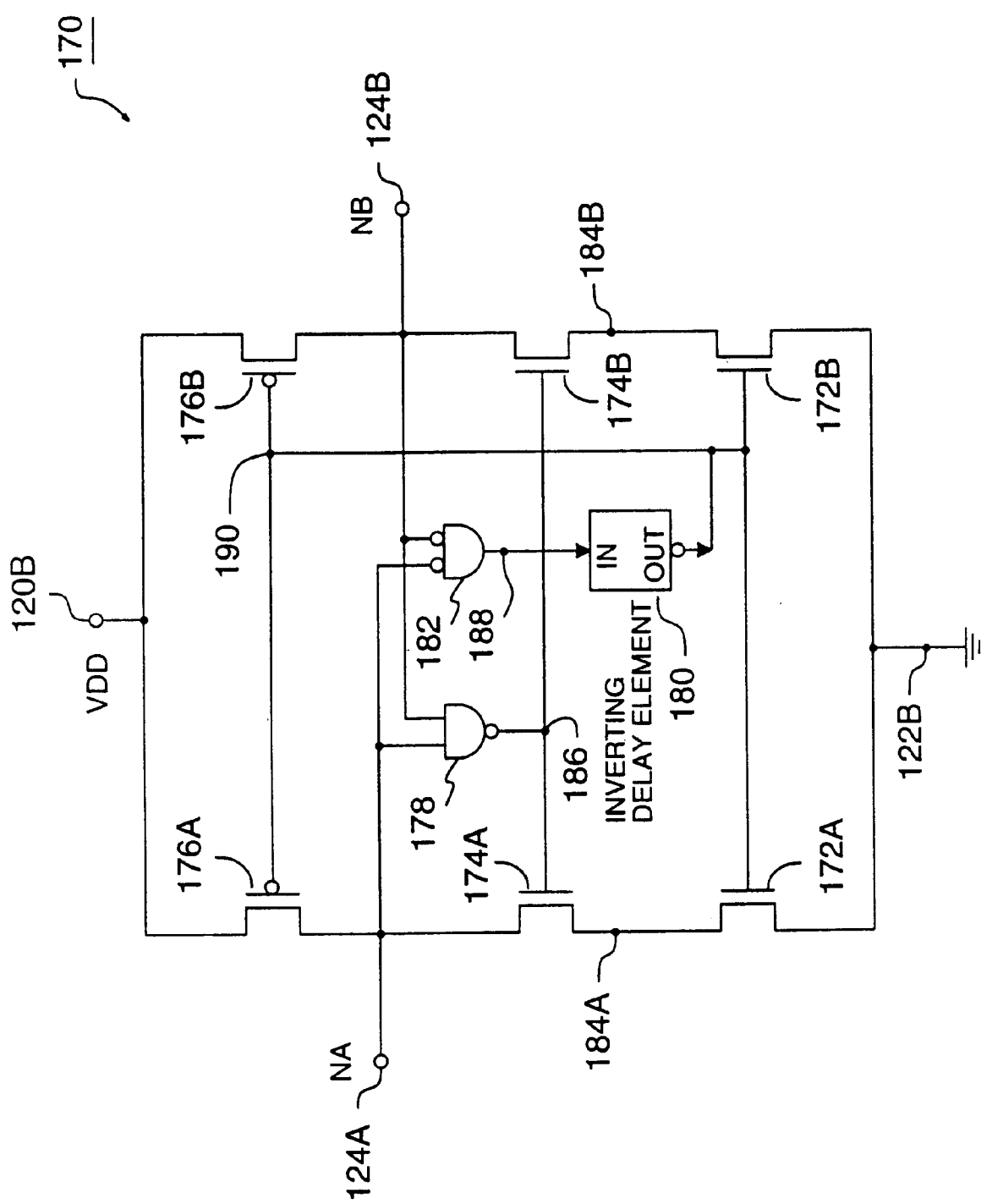
FIG. 7 shows the schematic of an embodiment of the bi-directional bus repeater in FIG. 5.

FIG. 7 shows the schematic of an embodiment 170 of a bi-directional bus repeater according to the present invention. Embodiment 170 comprises a stand-by supply node 120B, a signaling supply node 122B, and two network nodes 124A and 124B. Embodiment 170 further comprises five intermediate nodes 184A, 184B, 186, 188, and 190, four NMOS transistors 172A, 174A, 172B, and 174B, two PMOS transistors 176A and 176B, a logic NOR gates 182, a logic NAND gate 178, and an inverting delay element 180. Inverting delay element 180 has its input connected to intermediate node 188 and its output connected to intermediate node 190. Logic NOR gate 182 has its output connected to intermediate node 188, has its first input connected to network node 124A, and has its second input connected to network node 124B. Logic NAND gate 178 has its output connected to intermediate node 186, has its first input connected to network node 124A, and has its second input connected to network node 124B. PMOS transistor 176A has its gate connected to intermediate node 190, has its first current electrode connected to stand-by supply node 120B, and has its second current electrode connected to network node 124A. PMOS transistor 176B has its gate connected to intermediate node 190, has its first current electrode connected to stand-by supply node 120B, and has its second current electrode connected to network node 124B. NMOS transistor 172A has its gate connected to intermediate node 190, has its first current electrode connected to signaling supply node 122B and has its second current electrode connected to network node 184A. NMOS transistor 172B has its gate connected to intermediate node 190, has its first current electrode connected to signaling supply node 122B and has its second current electrode connected to network node 184B. NMOS transistor 174A has its gate connected to intermediate node 186, has its first current electrode connected to network node 124A and has its second current electrode connected to network node 184A. NMOS transistor 174B has its gate connected to intermediate node 186, has its first current electrode connected to network node 124B and has its second current electrode connected to network node 184B.

In embodiment 170 of a postcharged bi-directional bus repeater according to the present invention, shown in FIG. 7, the stand-by supply level on stand-by supply node 120B is the positive supply for the circuitry and equals a logic high level, and the signaling supply level on signaling supply node 122B is the negative supply for the circuitry and equals a logic low level. The operation of embodiment 170 is as follows. When a high level or stand-by level is present on both network nodes 124A and 124B for a sufficiently long period of time, a low level is present at the output of logic NAND gate 178, on intermediate node 186, a low level is present at the output of logic NOR gate 182, on intermediate node 188, and a high level is present at the output of inverting delay element 180, on intermediate node 190. Hence, both NMOS transistors 172A and 172B are on and both NMOS transistors 174A and 174B are off, and there are no low impedance conductive paths between network node 124A and signaling supply node 122B, through NMOS transistors 172A and 174A and through intermediate node 184A, or between network node 124B and signaling supply node 122B, through NMOS transistors 172B and 174B and through intermediate node 184B, respectively.

Also, since a high level is present on intermediate node 190, both PMOS transistors 176A and 176B are off. Embodiment 170 of the postcharged bi-directional bus repeater is hence in a first state, referred to as the "stand-by" state, in which it provides a high impedance at both network nodes 124A and 124B while monitoring their logic level.

Assume now that the logic level on network node 124A is pulled low by an external circuit, not shown in FIG. 7, to a level below the gate threshold of logic NAND gate 178, causing a rising transition on intermediate node 186, and turning on both NMOS transistors 174A and 174B. This creates two local conductive paths, a first between network node 124A and signaling supply node 122B, through NMOS transistors 172A and 174A, through intermediate node 184A, and a second between network node 124B and signaling supply node 122B, through NMOS transistors 172B and 174B, through intermediate node 184B. As a result, the transition on network node 124A from the stand-by level to the signaling level, which was initiated by an external circuit, is locally enhanced, and in addition is copied onto network node 124B, by embodiment 170 of the postcharged speed-up circuit according to the present invention. This is referred to as the "regenerative" state of the postcharged bi-directional bus repeater.

The falling transitions on both network nodes 124A and 124B propagate through logic NOR gate 182, causing a rising transition on intermediate node 188, which further propagates through inverting delay element 180, causing a falling transition on intermediate node 190. As a result, both NMOS transistors 172A and 172B are turned off, and the conductive paths between network node 124A and signaling supply node 122B, and between network node 124B and signaling supply node 122B, respectively, are both turned off. This marks the end of a first predetermined period of time, in which the speed-up circuit is in the "regenerative" state, after a level change has been detected on either of network nodes 124A or 124B, from the stand-by level towards the signaling level, past the threshold of logic NAND gate 178.

Concurrently, the falling transition on intermediate node 190 turns on both PMOS transistor 176A and 176B, creating local conductive paths between network node 124A and stand-by supply node 120B, and between network node 124B and stand-by supply node 120B, respectively. This marks the start of a second predetermined period of time, in which the speed-up circuit is in the "postcharge" state, during which the levels on both network node 124A and 124B are postcharged to the stand-by level.

We assume for now that the external circuit causing the initial transition from the stand-by level towards the signaling level on network node 124A is connected to network node 124A through a sufficiently high impedance compared to the on-resistance of PMOS transistor 176A, such that when embodiment 170 goes to the postcharge state, it effectively brings network node 124A to a high logic level should there be fighting between PMOS transistor 176A and and a low level on said external circuit. It is also assumed that the level provided by said external circuit returns to a stand-by level before the end of said second period of time during which the speed-up circuit is in the postcharge state.

The transition from a signaling or low level to a stand-by or high level on network node 124A ensures that the output of logic NAND gate 178, on intermediate node 186, goes to a low level, such that both NMOS transistors 174A and 174B turn off. This ensures that the conductive paths between network node 124A and signaling supply node 120B, and between network node 124A and signaling supply node 120B, respectively, remain off. The rising transitions on network nodes 124A and 124B, while embodiment 170 is in the postcharge state also propagate through logic NOR gate 182, causing a falling transition on intermediate node 188, which propagates further through inverting delay element 180, causing a rising transition on intermediate node 190. As a result, both PMOS transistors 176A and 176B are turned off. This marks the end of the second predetermined period of time, during which embodiment 80 is in the postcharge state. Embodiment 80 of the postcharged speed-up circuit now is back in its initial stand-by state.

Figure 8:
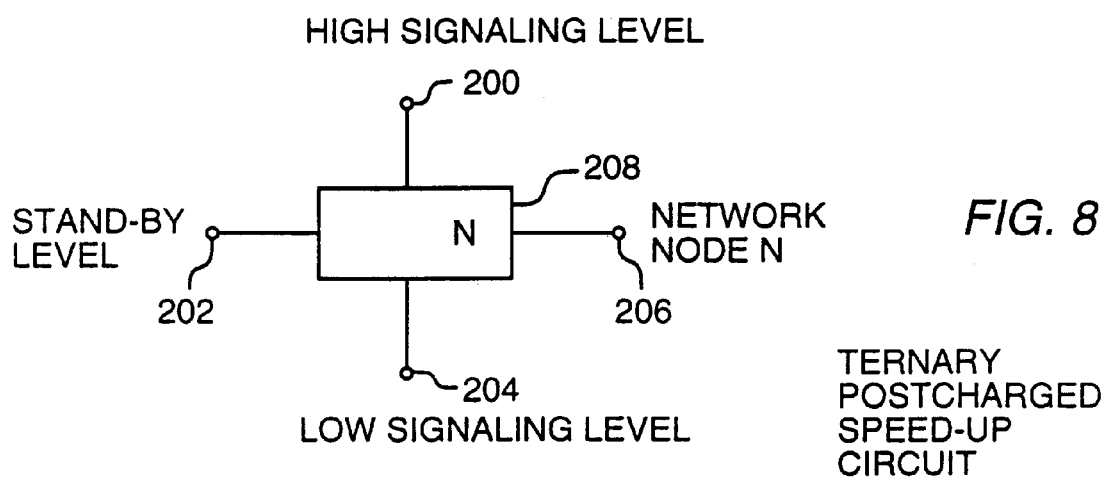
FIG. 8 shows a block diagram of an embodiment of a ternary postcharged speed-up circuit according to the present invention.

FIG. 8 shows a block diagram of a ternary postcharged speed-up circuit 208 according to the present invention, connected to a network node 206, a stand-by supply node 202 at a stand-by level, a high signaling supply node 200 at a high signaling level, that is substantially higher than stand-by level 202 in order to be logically distinguishable, and a low signaling supply node 204 at a low signaling level, that is substantially lower than stand-by level 202 in order to be logically distinguishable, The operation of ternary postcharged speed-up circuit 208 of FIG. 8 is as follows. Speed-up circuit 208 has 5 internal states. In a first state, called the stand-by state, speed-up circuit 208 provides a high-impedance equivalent to an open circuit at network node 206. In addition, while in the stand-by state, speed-up circuit 26 monitors the level on network node 206.

If the logic level on network node 206 is forced, by an external circuit, not shown in FIG. 8, to a level change exceeding a predetermined threshold, from an initial stand-by level towards a low signaling level, speed-up circuit 208 goes temporarily to a second state, called the low level regenerative state, for a first predetermined period of time. In the low level regenerative state, speed-up circuit 208 provides a low-impedance connection between network node 206 and the low signaling level on low signaling supply node 204.

Immediately following the first predetermined period of time in which speed-up circuit 208 is in the low level regenerative state, speed-up circuit 208 goes to a third state, referred to as the low level postcharge state, for a second predetermined period of time. In the low level postcharge state, speed-up circuit 208 provides a low-impedance connection between network node 206 and the stand-by level on stand-by supply node 202, after a falling transition on network node 206.

After the second predetermined period of time, speed-up circuit 208 returns to the stand-by state, in which it provides a high-impedance equivalent to an open circuit at network node 206.

If the logic level on network node 206 is forced, by an external circuit, not shown in FIG. 8, to a level change exceeding a predetermined threshold, from an initial stand-by level towards a high signaling level, speed-up circuit 208 goes temporarily to a fourth state, called the high level regenerative state, for a third predetermined period of time. In the high level regenerative state, speed-up circuit 208 provides a low-impedance connection between network node 206 and the high signaling level on high signaling supply node 200.

Immediately following the third predetermined period of time in which speed-up circuit 208 is in the high level regenerative state, speed-up circuit 208 goes to a fifth state, referred to as the high level postcharge state, for a fourth predetermined period of time. In the high level postcharge state, speed-up circuit 208 provides a low-impedance connection between network node 206 and the stand-by level on stand-by supply node 202, after a rising transition on network node 206.

After the fourth predetermined period of time, speed-up circuit 208 returns to the stand-by state, in which it provides a high-impedance equivalent to an open circuit at network node 206.

Hence, ternary postcharged speed-up circuit 208 is capable of regenerating a monostable pulse to either a high or a low signaling level, when triggered by an external circuit.

Figure 9:
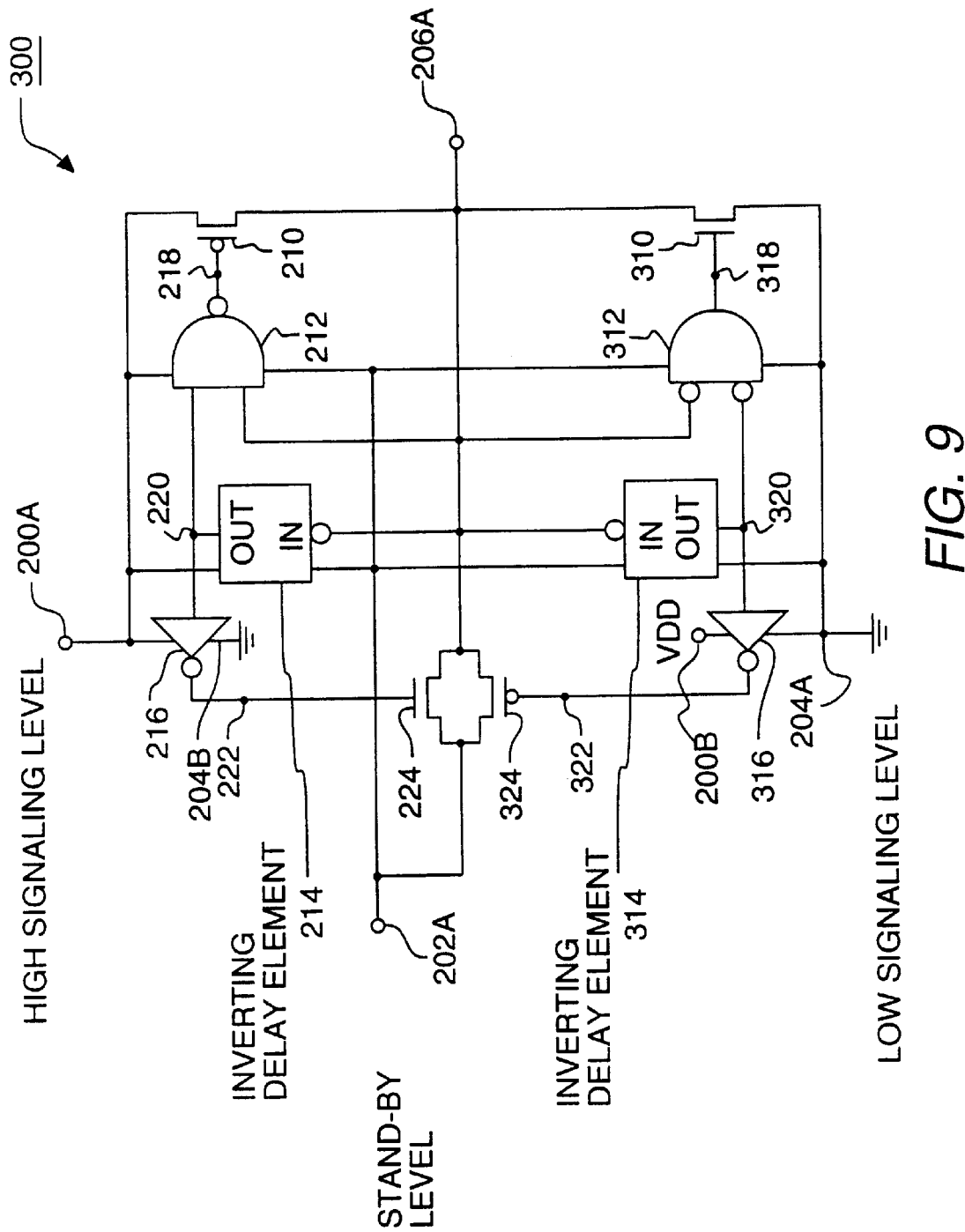
FIG. 9 shows the schematic of an embodiment of the speed-up circuit in FIG. 8.

FIG. 9 shows the schematic of an embodiment 300 of a ternary postcharged speed-up circuit according to the present invention. Embodiment 300 comprises a stand-by supply node 202A, two high signaling supply nodes 200A and 200B connected to the high signaling supply, two low signaling supply nodes 204A and 204B connected to the low signaling supply, and a network node 206A. Embodiment 300 further comprises six intermediate nodes 218, 220, 222, 318, 320 and 322, two PMOS transistors 210 and 324, two NMOS transistors 310 and 224, a logic NAND gate 212, a logic NOR gates 312, two inverting delay elements 214 and 314, and two inverters 216 and 316. Inverter 216 has its output connected to intermediate node 222, its input connected to intermediate node 220, its positive supply node connected to high signaling supply node 200A, and its negative supply node connected to low signaling supply node 204B. Inverting delay element 214 has its output connected to intermediate node 220, its input connected to network node 206A, its positive supply node connected to high signaling supply node 200A, and its negative supply node connected to stand-by supply node 202A. Logic NAND gate 212 has its output connected to intermediate node 218, its first input connected to network node 206A, its second input connected to intermediate node 220, its positive supply node connected to the high signaling supply node 200A, and its negative supply node connected to the stand-by supply node 202A. PMOS transistor 210 has its gate connected to intermediate node 218, has its first current electrode connected to high signaling supply node 200A, and has its second current electrode connected to network node 206A. NMOS transistor 224 has its gate connected to intermediate node 222, has its first current electrode connected to stand-by supply node 202A, and has its second current electrode connected to network node 206A.

Inverter 316 has its output connected to intermediate node 322, its input connected to intermediate node 320, its positive supply node connected to high signaling supply node 200B, and its negative supply node connected to low signaling supply node 204A. Inverting delay element 314 has its output connected to intermediate node 320, its input connected to network node 206A, its positive supply node connected to stand-by supply node 202A, and its negative supply node connected to low signaling supply node 204A. Logic NOR gate 312 has its output connected to intermediate node 318, its first input connected to network node 206A, its second input connected to intermediate node 320, its positive supply node connected to the stand-by supply node 202A, and its negative supply node connected to the low signaling supply node 204A. NMOS transistor 310 has its gate connected to intermediate node 318, has its first current electrode connected to low signaling supply node 204A, and has its second current electrode connected to network node 206A. PMOS transistor 324 has its gate connected to intermediate node 322, has its first current electrode connected to stand-by supply node 202A, and has its second current electrode connected to network node 206A.

The operation of embodiment 300 of a ternary post-charged speed-up circuit according to the present invention is as follows.

It is clear that, since inverting delay element 214 and logic NAND gate 212 both have their negative supply node connected to stand-by supply node 202A, they interpret an input signal around the stand-by supply level or lower as a logic low input. Also, their logic low output level is at the stand-by supply level, and their logic high output level is at the high signaling level. Similarly, since inverting delay element 314 and logic NOR gate 312 both have their positive supply node connected to stand-by supply node 202A, they interpret an input signal around the stand-by supply level or higher as a logic high input, their logic high output level is at the stand-by supply level, and their logic low output level is at the low signaling level. Inverter 216 has its negative supply node connected to low signaling level 204B. In this embodiment, it is a design requirement that the gate threshold of inverter 216 is above the stand-by supply level, preferable about halfway between the stand-by supply level and the high signaling supply level. This ensures that a logic low on intermediate node 220, at the output of inverting delay element 214, is interpreted by inverter 216 as a logic low. The logic high at the output of inverter 216 is near the high signaling supply level. Since the negative supply node of inverter 216 is connected to low signaling supply node 204B, a logic low at the output of inverter 216 is at the low signaling supply level, and is capable of turning off NMOS transistor 224 completely, even when network node 206A is at a low signaling level.

Similarly, in this embodiment, it is a design requirement that the gate threshold of inverter 316 is below the stand-by supply level, preferable about halfway between the stand-by supply level and the low signaling supply level. This ensures that a logic high on intermediate node 320, at the output of inverting delay element 314, is interpreted by inverter 316 as a logic high. The logic low at the output of inverter 316 is near the low signaling supply level. Since the positive supply node of inverter 316 is connected to high signaling supply node 200B, a logic high at the output of inverter 316 is at the high signaling supply level, and is capable of turning off PMOS transistor 324 completely, even when network node 206A is at a high signaling level.

When a stand-by level is present on network node 206A for a sufficiently long period of time, this is interpreted as a low logic level by both inverting delay element 214 and logic NAND gate 212, and hence high signaling levels are present their outputs, on intermediate nodes 220 and 218, respectively. As a result, PMOS transistor 210 is off, and there is no conductive path between network node 206A and high signaling supply node 200A. The high logic level on intermediate node 220 also brings the output of inverter 216, on intermediate node 222, to its low logic level, which equals the low signaling level. Hence, NMOS transistor 224 is off. Similarly, the stand-by level on network node 206A is interpreted as a high logic level by both inverting delay element 314 and logic NOR gate 312, and hence low signaling levels are present their outputs, on intermediate nodes 320 and 318, respectively. As a result, NMOS transistor 310 is off, and there is no conductive path between network node 206A and low signaling supply node 204A. The low logic level on intermediate node 320 also brings the output of inverter 316, on intermediate node 322, to its high logic level, which equals the high signaling level. Hence, PMOS transistor 324 is off. The ternary postcharged speed-up circuit is in a first state, referred to as the stand-by state, in which it provides a high impedance at network node 206A, while network node 206A remains at the stand-by level.

Assume now that the logic level on network node 206A is pulled low by an external circuit, not shown in FIG. 9, to a level below the gate threshold of logic NOR gate 312. The output of logic NOR gate 312, on intermediate node 318, goes to a logic high level, which equals the stand-by level due to the connection of the positive supply node of logic NOR gate 312 to stand-by supply node 202A. Hence, NMOS transistor 310 turns on, and a conductive path is established between network node 206A and low signaling level 204A. As a result, the transition on network node 206A, from the stand-by level to the low signaling level, which was initiated by an external circuit, is locally enhanced by embodiment 300 of the ternary postcharged speed-up circuit according to the present invention. This is referred to as the "low level regenerative state" of the speed-up circuit.

Eventually, the falling transition on network node 206A propagates to the output of inverting delay element 314 and causes its output, appearing on intermediate node 320, to go from a low logic level to a high logic level equaling the stand-by level. This in turn causes the output of logic NOR gate 312 to return to a low logic level equaling the low signaling level, which turns off NMOS transistor 310. This marks the end of a first predetermined period of time, in which the speed-up circuit is in the "low level regenerative state", after a level change has been detected on network node 206A from the stand-by level towards the low signal level, past the threshold of logic NOR gate 312.

Concurrently, the rising transition on intermediate node 320 propagates through inverter 316 and causes its output to go from an initial high logic level equaling the high signaling level to a low logic level equaling the low signaling level, thus turning on PMOS transistor 324. This creates a local conductive path between network node 206A and stand-by supply node 202A. This marks the start of a second predetermined period of time, in which the speed-up circuit is in the "low level postcharge state", during which the level on network node 206A is postcharged to the stand-by level after a falling transition.

We assume for now that the external circuit causing the initial transition from the stand-by level towards the low signaling level on network node 206A is connected through a sufficiently high impedance compared to the on-resistance of PMOS transistor 324, such that when embodiment 300 goes to the low level postcharge state, it effectively brings network node 206A to a level that is interpreted as a high logic level by inverting delay element 314 and by logic NOR gate 312. It is also assumed that the level provided by said external circuit returns to a stand-by level before the end of said second period of time during which the speed-up circuit is in the low level postcharge state.

The transition from a low signaling level to a stand-by level on network node 206A ensures that the output of logic NOR gate 312, on intermediate node 318, remains at a low level, such that NMOS transistor 310 remains off. Said rising transition on network node 206A also propagates through inverting delay element 314, causing a falling transition on intermediate node 320, and further propagates through inverter 316, causing a rising transition on intermediate node 322. This rising transition on intermediate node 322 turns off PMOS transistor 324. This marks the end of the second predetermined period of time, during which embodiment 300 is in the low level postcharge state. Embodiment 300 of the ternary postcharged speed-up circuit now is back in its initial stand-by state.

It is clear that while the level on network node 206A remains equal to or below the stand-by level, it remains interpreted by inverting delay element 214 and logic NAND gate 212 as a logic low level, and hence no logic changes occur in the pull-up part of embodiment 300, while embodiment 300 is in the low level regenerative state, or in the low level postcharge state.

Assume now that the logic level on network node 206A is pulled high by an external circuit, not shown in FIG. 9, to a level above the gate threshold of logic NAND gate 212. The output of logic NAND gate 212, on intermediate node 218, goes to a logic low level, which equals the stand-by level due to the connection of the negative supply node of logic NAND gate 212 to stand-by supply node 202A. Hence, PMOS transistor 210 turns on, and a conductive path is established between network node 206A and high signaling level 200A. As a result, the transition on network node 206A, from the stand-by level to the high signaling level, which was initiated by an external circuit, is locally enhanced by embodiment 300 of the ternary postcharged speed-up circuit according to the present invention. This is referred to as the "high level regenerative state" of the speed-up circuit.

Eventually, the rising transition on network node 206A propagates to the output of inverting delay element 214 and causes its output, appearing on intermediate node 220, to go from a high logic level to a low logic level equaling the stand-by level. This in turn causes the output of logic NAND gate 212 to return to a high logic level equaling the high signaling level, which turns off PMOS transistor 210. This marks the end of a third predetermined period of time, in which the speed-up circuit is in the "high level regenerative state", after a level change has been detected on network node 206A from the stand-by level towards the high signal level, past the threshold of logic NAND gate 212.

Concurrently, the falling transition on intermediate node 220 propagates through inverter 216 and causes its output to go from an initial low logic level equaling the low signaling level to a high logic level equaling the high signaling level, thus turning on NMOS transistor 224. This creates a local conductive path between network node 206A and stand-by supply node 202A. This marks the start of a fourth predetermined period of time, in which the speed-up circuit is in the "high level postcharge state", during which the level on network node 206A is postcharged to the stand-by level after a rising transition.

We assume for now that the external circuit causing the initial transition from the stand-by level towards the high signaling level on network node 206A is connected through a sufficiently high impedance compared to the on-resistance of NMOS transistor 224, such that when embodiment 300 goes to the high level postcharge state, it effectively brings network node 206A to a level that is interpreted as a low logic level by inverting delay element 214 and by logic NAND gate 212. It is also assumed that the level provided by said external circuit returns to a stand-by level before the end of said fourth period of time during which the speed-up circuit is in the high level postcharge state.

The transition from a high signaling level to a stand-by level on network node 206A ensures that the output of logic NAND gate 212, on intermediate node 218, remains at a high logic level, such that PMOS transistor 210 remains off. Said falling transition on network node 206A also propagates through inverting delay element 214, causing a rising transition on intermediate node 220, and further propagates through inverter 216, causing a falling transition on intermediate node 222. This falling transition on intermediate node 222 turns off NMOS transistor 224. This marks the end of the fourth predetermined period of time, during which embodiment 300 is in the high level postcharge state. Embodiment 300 of the ternary postcharged speed-up circuit now is back in its initial stand-by state.

It is clear that while the level on network node 206A remains equal to or above the stand-by level, it remains interpreted by inverting delay element 314 and logic NOR gate 312 as a logic high level, and hence no logic changes occur in the pull-down part of embodiment 300, while embodiment 300 is in the high level regenerative state, or in the high level postcharge state.

It is clear that sequences of pulses to high and low signaling levels applied to network node 206A are regenerated by embodiment 300. When a plurality of ternary postcharged speed-up circuits have their network nodes connected to intermediate nodes of a programmable interconnect architecture, similar to the architecture described in FIG. 2, sequences of pulses to high and low signaling levels applied to one node quickly propagate to the connected nodes. Such ternary signaling can be used in place of complementary signal pairs.

It is possible to separate the circuitry used for regeneration of a low signaling level and subsequent post-charging, on one hand, and the circuitry used for regeneration of a high signaling level and subsequent post-charging, on the other hand. Thus separated circuitry for pull-up and pull-down can be placed independently of each other at the nodes of a programmable interconnect architecture, while still achieving propagation of pulses from the stand-by level to high and low signaling levels. This allows additional optimization in the case where the propagation delay of an excursion from the stand-by level to the high signaling level is substantially different from the propagation delay of an excursion from the stand-by level to the low signaling level, for example in a programmable interconnect architecture that employs NMOS pass transistors as programmable interconnect elements.

Figure 10:
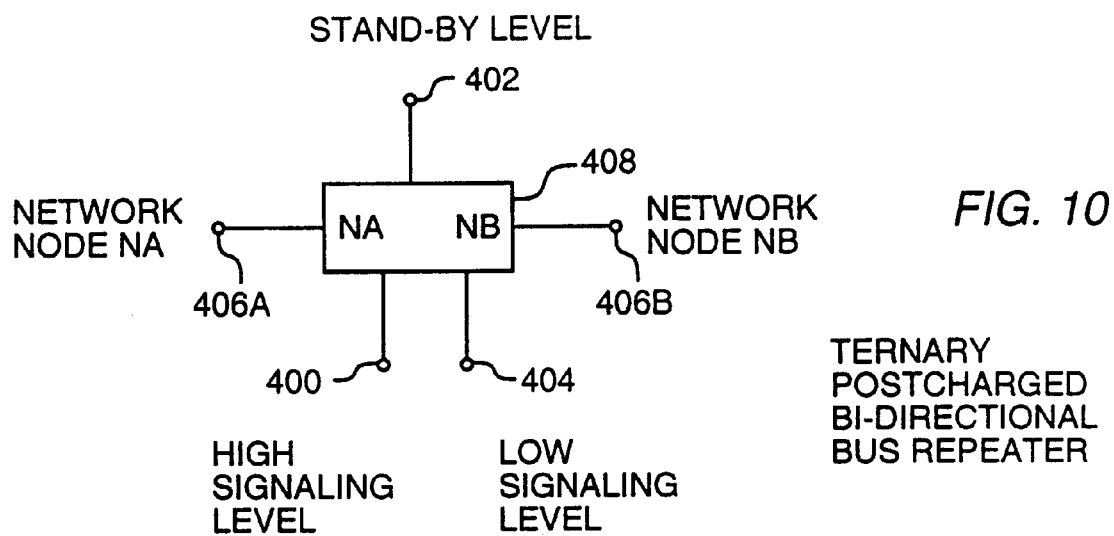
FIG. 10 shows a block diagram of an embodiment of a ternary postcharged bi-directional bus repeater according to the present invention.

FIG. 10 shows a block diagram of a ternary postcharged bi-directional bus repeater 408 according to the present invention, connected to two network nodes 406A and 406B, a stand-by supply node 402 at a stand-by level, a high signaling supply node 400 at a high signaling level, that is substantially higher than stand-by level 402 in order to be logically distinguishable, and a low signaling supply node 404 at a low signaling level, that is substantially lower than stand-by level 402 in order to be logically distinguishable, The operation of bus repeater 408 of FIG. 10 is as follows. Bus repeater 408 has five internal states. In a first state, called the stand-by state, bus repeater 408 provides a high-impedance equivalent to an open circuit at network nodes 406A and 406B. In addition, while in the stand-by state, bus repeater 408 monitors the logic level on network nodes 406A and 406B.

If the logic level on either of network nodes 406A or 406B is forced, by an external circuit, not shown in FIG. 10, to a level change exceeding a predetermined threshold, from an initial stand-by level towards said low signaling level, bus repeater 408 goes temporarily to a second state, called the low level regenerative state, for a first predetermined period of time. In the low level regenerative state, bus repeater 408 provides a low-impedance connection between network node 406A and the low signaling level on low signaling supply node 404, and between network node 406B and the low signaling level on low signaling supply node 404, respectively.

Immediately following the first predetermined period of time in which bus repeater 408 is in the low level regenerative state, bus repeater 408 temporarily goes to a third state, referred to as the low level postcharge state, for a second predetermined period of time. In the low level postcharge state, bus repeater 408 provides a low-impedance connection between network 406A and the stand-by level on stand-by supply node 402, and between network 406B and the stand-by level on stand-by supply node 402, respectively.

After the second predetermined period of time, bus repeater 408 returns to the stand-by state, in which it provides a high-impedance equivalent to an open circuit at both network nodes 406A and 406B.

If the logic level on either of network nodes 406A or 406B is forced, by an external circuit, not shown in FIG. 10, to a level change exceeding a predetermined threshold, from an initial stand-by level towards said high signaling level, bus repeater 408 goes temporarily to a fourth state, called the high level regenerative state, for a third predetermined period of time. In the high level regenerative state, bus repeater 408 provides a low-impedance connection between network node 406A and the high signaling level on high signaling supply node 404, and between network node 406B and the high signaling level on high signaling supply node 404, respectively.

Immediately following the third predetermined period of time in which bus repeater 408 is in the high level regenerative state, bus repeater 408 temporarily goes to a fifth state, referred to as the high level postcharge state, for a fourth predetermined period of time. In the high level postcharge state, bus repeater 408 provides a low-impedance connection between network 406A and the stand-by level on stand-by supply node 402, and between network 406B and the stand-by level on stand-by supply node 402, respectively.

After the fourth predetermined period of time, bus repeater 408 returns to the stand-by state, in which it provides a high-impedance equivalent to an open circuit at both network nodes 406A and 406B.

Hence, bus repeater 408 is capable of regenerating a monostable pulse to a low or a high signaling level on either of its network nodes when triggered by external circuitry, and is capable of copying that monostable pulse onto its other network node.

It is clear that this principle can be extended to a bus repeater with more than two network nodes.

This detailed description of this invention is meant to be illustrative only and not limiting. Other embodiments of this invention will be obvious to those skilled in the art in view of this disclosure.

In particular, the signals applied to the network nodes of postcharged speed-up circuit 26 of FIG. 1, postcharged bi-directional bus repeater 126 of FIG. 5, ternary postcharged speed-up circuit 208 of FIG. 8, and ternary postcharged bi-directional bus repeater 408 of FIG. 10, respectively, are not limited to monostable pulses, and the driver of the applied signal can have an impedance out of the range that was assumed in this description.

For example, by connecting the network node of postcharged speed-up circuit 26 of FIG. 1 through a driver impedance to an analog supply voltage, that is between stand-by level 10 and signaling level 12, postcharged speed-up circuit 26 now keeps rotating through a cycle of the three states described earlier, namely, stand-by state, regenerative state, and postcharge state. The speed-up circuit remains in the stand-by state for the period of time required to charge the network node to the threshold of the speed-up circuit. This period of time is determined by the driver impedance, the analog supply level, the network node capacitance, and the threshold at which the regenerative state is turned on. Thus a pulse generator is obtained.

It is clear that by changing the analog supply level, or by changing the driver impedance value, the time during which the speed-up circuit remains in the stand-by state can be changed. As a result, the frequency of the pulse train generated by appling an analog supply voltage through a driver impedance to a postcharged speed-up circuit can be modulated by changing the driver impedance or the analog supply level.

In a programmable interconnect architecture such as the one described in FIG. 2, sending buffers 28A and 28B can be replaced by modulator circuits each consisting of an analog supply and a driving impedance. Thus, frequency modulated pulse trains can be generated, and are quickly propagated through a programmable interconnect architecture similar to the one described in FIG. 2. The frequency can be controlled by changing the analog supply or the driver impedance of the modulator circuits. In addition, receiving buffers 32A and 32B of FIG. 2 can be replaced by demodulator circuits capable of demodulating a frequency modulated pulse train into an analog voltage or current.

Thus, the programmable interconnect architecture of FIG. 2 can be used to quickly transmit analog values by coding them into frequency modulated digital pulses and using postcharged speed-up circuits for propagation of said digital pulses.

Similarly, it is clear that analog values with positive or negative sign can be propagated in a programmable interconnect architecture by using a plurality of instances of ternary postcharged speed-up circuit 208 of FIG. 8.

Finally, it is clear that the circuits of FIGS. 1 through 10 remain functional as described here when used in a programmable interconnect architecture in which the programming state of the programmable interconnect elements is changed, and hence in which the programmed paths are changed, during operation of the integrated circuit.

What is claimed is:

1. In an integrated circuit, a postcharged speed-up circuit,
   said postcharged speed-up circuit comprising a stand-by supply node, a signaling supply node, a network node and circuitry,
   said circuitry providing means to detect a change exceeding a first predetermined threshold from a stand-by logic level towards a signaling logic level on said network node,
   and said circuitry providing means to provide a low impedance connection between said network node and said signaling supply node for a first predetermined period of time, when said change occurs,
   and said circuitry providing means to provide a low impedance connection between said network node and said stand-by supply node, for a second predetermined period of time, immediately following said first period of time.

2. In an integrated circuit, the postcharged speed-up circuit of claim 1, wherein said integrated circuit further comprises a bus connected to said network node of said postcharged speed-up circuit.

3. In an integrated circuit, the postcharged speed-up circuit of claim 1, wherein said integrated circuit further comprises a substantially resistive and capacitive conductive path having a node connected to said network node of said postcharged speed-up circuit.

4. In an integrated circuit, the postcharged speed-up circuit of claim 1, wherein said integrated circuit further comprises logic circuitry having a node connected to said network node of said postcharged speed-up circuit.

5. In an integrated circuit, the postcharged speed-up circuit of claim 1, wherein said integrated circuit further comprises analog circuitry having a node connected to said network node of said postcharged speed-up circuit.

6. The postcharged speed-up circuit of claim 1, said postcharged speed-up circuit further comprising at least one MOS transistor.

7. The postcharged speed-up circuit of claim 1, said postcharged speed-up circuit further comprising at least one logic gate chosen from the group consisting of inverters, AND gates, NAND gates, OR gates, NOR gates, and delay elements.

8. The postcharged speed-up circuit of claim 6, said postcharged speed-up circuit further comprising at least one logic gate chosen from the group consisting of inverters, AND gates, NAND gates, OR gates, NOR gates, and delay elements.

9. In an integrated circuit, a programmable interconnect architecture, comprising:

a plurality of wiring segments interconnected by a plurality of programmable switches, each of said programmable switches having two terminals, and each of said switches being characterized by a first programming state in which a low impedance bi-directional electrical connection is provided between said two terminals, and by a second programming state in which said two terminals are electrically disconnected, a plurality of speed-up circuits, said speed-up circuits each comprising a stand-by supply node, a signaling supply node, a network node and circuitry, said circuitry providing means to detect a change exceeding a first predetermined threshold from a stand-by logic level towards a signaling logic level on said network node, and said circuitry providing means to provide a low impedance connection between said network node and said signaling supply node for a first predetermined period of time, when said change occurs, and said circuitry providing means to provide a low impedance connection between said network node and said stand-by supply node for a second predetermined period of time, immediately following said first period of time, where at least some of said wiring segments of said routing network are each directly connected to a matching one of said network nodes of said speed-up circuits.

10. The programmable interconnect architecture of claim 9, wherein said first predetermined period of time is chosen longer than a first propagation delay required to charge said network node of a neighboring one of said plurality of speed-up circuits, through a series of at least one of said programmable switches in said first programming state, until a potential change from said initial stand-by logic level towards said signaling logic level exceeding said first predetermined threshold is achieved, and wherein said second predetermined period of time is chosen longer than a first charging delay required by said speed-up circuits, to substantially charge said network node of each of said speed-up circuits, from said signaling logic level to said stand-by logic level.

11. The programmable interconnect architecture of claim 9 wherein said integrated circuit further comprises at least one functional block chosen from the group consisting of user-programmable logic arrays, memories, microprocessors, digital signal processors, analog neural networks, digital neural networks, solid-state displays, solid-state imagers, self-routing switching networks, and telecommunications switching networks.

12. The programmable interconnect architecture of claim 9 wherein said interconnect architecture is used for propagating frequency modulated digital pulses.

13. The programmable interconnect architecture of claim 9 wherein said interconnect architecture is used for propagating pulses between self-timed circuits.

14. The programmable interconnect architecture of claim 9 wherein said interconnect architecture is used for propagating pulses between clocked circuits.

15. The programmable interconnect architecture of claim 9 wherein said interconnect architecture is used for propagating complementary signal pairs.

16. In an integrated circuit, a bi-directional bus repeater, having a stand-by supply node, a signaling supply node, first and second network nodes, and circuitry, said circuitry providing means to detect a change exceeding a predetermined threshold from a stand-by logic level towards a signaling logic level on at least one of said first and second network nodes, and said circuitry providing means to, for a first predetermined period of time, provide a low-impedance connection between said first network node and said signaling supply node, as well as between said second network node and said signaling supply node, when said change occurs, and said circuitry providing means to, for a second predetermined period of time, immediately following said first predetermined period of time, provide a low-impedance connection between said first network node and said stand-by supply node, as well as between said second network node and said stand-by supply node.

17. In an integrated circuit, a ternary encoded, complementary, postcharged speed-up circuit, said postcharged speed-up circuit comprising a low signaling supply node, a high signaling supply node, a stand-by supply node at a ternary logic level between said low and said high signaling supply nodes, a network node and first and second circuitry, said first circuitry providing means to detect a first change exceeding a first predetermined threshold from a stand-by logic level towards a low signaling logic level on said network node, and said first circuitry providing means to provide a low impedance connection between said network node and said low signaling supply node for a first predetermined period of time, when said first change occurs, and said first circuitry providing means to provide a low impedance connection between said network node and said stand-by supply node, for a second predetermined period of time, immediately following said first period of time, and said second circuitry providing means to detect a second change exceeding a second predetermined threshold from a stand-by logic level towards a high signaling logic level on said network node, and said second circuitry providing means to provide a low impedance connection between said network node and said high signaling supply node for a third predetermined period of time, when said second change occurs, and said second circuitry providing means to provide a low impedance connection between said network node and said stand-by supply node, for a fourth predetermined period of time, immediately following said third period of time.

18. In an integrated circuit, a programmable interconnect architecture comprising:

a plurality of wiring segments interconnected by a plurality of programmable switches, each of said programmable switches having two terminals, and each of said switches being characterized by a first programming state in which a low impedance bi-directional electrical connection is provided between said two terminals, and by a second programming state in which said two terminals are electrically disconnected, a plurality of first and second speed-up circuits, each of said first speed-up circuits comprising a low signaling supply node, a first stand-by supply node, a first network node and first circuitry, each of said second speed-up circuits comprising a high signaling supply node, a second stand-by supply node, a second network node and second circuitry, said first and second stand-by supply nodes being at a ternary logic level between said low and said high signaling supply nodes, said first circuitry providing means to detect a first change exceeding a first predetermined threshold from a stand-by logic level towards a low signaling logic level on said first network node, said first circuitry providing means to provide a low impedance connection between said first network node and said low signaling supply node for a first predetermined period of time, when said first change occurs, and said first circuitry providing means to provide a low impedance connection between said first network node and said stand-by supply node, for a second predetermined period of time, immediately following said first period of time, and said second circuitry providing means to detect a second change exceeding a second predetermined threshold from a stand-by logic level towards a high signaling logic level on said second network node, and said second circuitry providing means to provide a low impedance connection between said second network node and said high signaling supply node for a third predetermined period of time, when said second change occurs, and said second circuitry providing means to provide a low impedance connection between said second network node and said stand-by supply node, for a fourth predetermined period of time, immediately following said third period of time, where at least some of said wiring segments of said routing network are each directly connected to a matching one of said first network nodes of said first speed-up circuits, and where at least some of said wiring segments of said routing network are each directly connected to a matching one of said second network nodes of said second speed-up circuits.

19. In an integrated circuit, a ternary encoded, complementary, bi-directional bus repeater, comprising a low signaling supply node, a high signaling supply node, a stand-by supply node at a ternary logic level between said low and said high signaling supply nodes, first and second network nodes, and circuitry, said circuitry providing means to detect a change exceeding a predetermined threshold from a stand-by logic level towards a low signaling logic level on at least one of said first and second network nodes, and said circuitry providing means to, for a first predetermined period of time, provide a low-impedance connection between said first network node and said low signaling supply node, as well as between said second network node and said low signaling supply node, when said change occurs, and said circuitry providing means to, for a second predetermined period of time following said first predetermined period of time, provide a low-impedance connection between said first network node and said stand-by supply node, as well as between said second network node and said stand-by supply node, and said circuitry providing means to detect a change exceeding a predetermined threshold from a stand-by logic level towards a high signaling logic level on at least one of said first and second network nodes, and said circuitry providing means to, for a third predetermined period of time, provide a low-impedance connection between said first network node and said high signaling supply node, as well as between said second network node and said high signaling supply node, when said change occurs, and said circuitry providing means to, for a fourth predetermined period of time following said third predetermined period of time, provide a low-impedance connection between said first network node and said stand-by supply node, as well as between said second network node and said stand-by supply node.

* * * * *